(12) United States Patent
Tokunaga et al.

(10) Patent No.: US 11,506,980 B2
(45) Date of Patent: Nov. 22, 2022

(54) RESIST UNDERLAYER FILM FORMING COMPOSITION USING A FLUORENE COMPOUND

(71) Applicant: NISSAN CHEMICAL CORPORATION, Tokyo (JP)

(72) Inventors: Hikaru Tokunaga, Toyama (JP);
Keisuke Hashimoto, Toyama (JP);
Rikimaru Sakamoto, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 576 days.

(21) Appl. No.: 16/497,064

(22) PCT Filed: Apr. 20, 2018

(86) PCT No.: PCT/JP2018/016274
§ 371 (c)(1),
(2) Date: Sep. 24, 2019

(87) PCT Pub. No.: WO2018/198960
PCT Pub. Date: Nov. 1, 2018

(65) Prior Publication Data
US 2020/0379350 A1    Dec. 3, 2020

(30) Foreign Application Priority Data

Apr. 25, 2017  (JP) .............................. JP2017-085898

(51) Int. Cl.
| | | |
|---|---|---|
| G03F 7/11 | (2006.01) | |
| C08G 61/12 | (2006.01) | |
| C09D 165/00 | (2006.01) | |
| H01L 21/027 | (2006.01) | |
| H01L 21/3065 | (2006.01) | |
| H01L 21/308 | (2006.01) | |

(52) U.S. Cl.
CPC .............. *G03F 7/11* (2013.01); *C08G 61/124* (2013.01); *C09D 165/00* (2013.01); *H01L 21/0274* (2013.01); *H01L 21/308* (2013.01); *H01L 21/3065* (2013.01); *C08G 2261/11* (2013.01); *C08G 2261/124* (2013.01); *C08G 2261/148* (2013.01); *C08G 2261/1422* (2013.01); *C08G 2261/18* (2013.01); *C08G 2261/228* (2013.01); *C08G 2261/312* (2013.01); *C08G 2261/3162* (2013.01); *C08G 2261/3241* (2013.01)

(58) Field of Classification Search
CPC ........ G03F 7/11; G03F 7/0397; G03F 7/2004; G03F 7/2059; C09D 165/00; C08G 61/124; C08G 61/10; C08G 2261/11; C08G 2261/124; C08G 2261/18; C08G 2261/228312; C08G 2261/3162; C08G 2261/3241; C08G 2261/1412; C08G 2261/1414; C08G 2261/1422; C08G 2261/1426; C08G 2261/1428; C08G 2261/1452; C08G 2261/148; C08G 2261/149; H01L 21/0274; H01L 21/3065; H01L 21/308
See application file for complete search history.

(56) References Cited

U.S. PATENT DOCUMENTS

| | | |
|---|---|---|
| 9,263,286 B2 | 2/2016 | Sakamoto et al. |
| 9,746,772 B2 | 8/2017 | Okuyama et al. |
| 2016/0363864 A1 | 12/2016 | Park et al. |

FOREIGN PATENT DOCUMENTS

| | | |
|---|---|---|
| JP | 2013-137334 A | 7/2013 |
| JP | WO2014/171326 A1 | 10/2014 |
| JP | 2015-189694 A | 11/2015 |
| WO | 2010/041626 A1 | 4/2010 |
| WO | 2012/050064 A1 | 4/2012 |
| WO | 2013/047516 A1 | 4/2013 |

OTHER PUBLICATIONS

Jul. 10, 2018 International Search Report issued in International Patent Application No. PCT/JP2018/016274.

*Primary Examiner* — Shane Fang
(74) *Attorney, Agent, or Firm* — Oliff PLC

(57) ABSTRACT

Provided are: a resist underlayer film formation composition combining high etching resistance, high heat resistance, and excellent coating properties; a resist underlayer film in which the resist underlayer film formation composition is used and a method for manufacturing the resist underlayer film; a method for forming a resist pattern; and a method for manufacturing a semiconductor device. The resist underlayer film formation composition is characterized by including the compound represented by Formula (1), or a polymer derived from the compound represented by Formula (1) (where: AA represents a single bond or a double bond; $X^1$ represents —N($R^1$)—; $X^2$ represents —N($R^2$)—; $X^3$ represents —CH($R^3$)—; $X^4$ represents —CH($R^4$)— etc.; $R^1$, $R^2$, $R^3$, and $R^4$ represent hydrogen atoms, C1-20 straight chain, branched, or cyclic alkyl groups, etc.; $R^5$, $R^6$, $R^9$, and $R^{10}$ represent hydrogen atoms, hydroxy groups, alkyl groups, etc.; $R^7$ and $R^8$ represent benzene rings or naphthalene rings; and n and o are 0 or 1). A semiconductor device is manufactured by: coating the composition on a semiconductor substrate, firing the coated composition, and forming a resist underlayer film; forming a resist film thereon with an inorganic resist underlayer film interposed therebetween selectively as desired; forming a resist pattern by irradiating light or electron radiation and developing; etching the underlayer film using the resist pattern; and processing the semiconductor substrate using the patterned underlayer film.

12 Claims, No Drawings

RESIST UNDERLAYER FILM FORMING COMPOSITION USING A FLUORENE COMPOUND

TECHNICAL FIELD

The present invention relates to a resist underlayer film forming composition having high etching resistance and high heat resistance as well as excellent application properties, a resist underlayer film using the resist underlayer film forming composition and a method for producing the same, a method for forming a resist pattern, and a method for producing a semiconductor device.

BACKGROUND ART

In recent years, there have been strong demands for a resist underlayer film having properties of high etching resistance and high heat resistance. It has been reported that a resist underlayer film produced from a resist underlayer film material for a multilayer lithography process containing a phenylnaphthylamine novolak resin (Patent Literature 1) and a resist underlayer film produced from a resist underlayer film forming composition for lithography, which composition contains a polymer containing a unit structure having an arylene group or a heterocyclic group (Patent Literature 2) have not only high heat resistance so as to permit formation of a hard mask on the film by vapor deposition, but also an effect as an antireflection film.

CITATION LIST

Patent Literature

Patent Literature 1: WO 2013/047516 A1
Patent Literature 2: WO 2012/050064 A1

SUMMARY OF INVENTION

Technical Problem

As resist patterns are becoming even finer, resist layers are needed to be reduced in thickness. For meeting such a need, there has been know a lithography process, in which at least two resist underlayer film layers are formed, and the resist underlayer film layers are used as a mask material. This is a method including the steps of forming at least one layer of an organic film (organic underlayer film) and at least one layer of an inorganic underlayer film on a semiconductor substrate, patterning the inorganic underlayer film using a resist pattern formed in the upper layer resist film as a mask, and patterning the organic underlayer film using the above pattern as a mask. It is stated that the method permits formation of a pattern having a high aspect ratio. The materials for forming the at least two layers may include a combination of an organic resin (for example, an acrylic resin or a novolak resin), an inorganic material (silicone resin (for example, organopolysiloxane), and an inorganic silicon compound (for example, SiON or SiO$_2$). Recently, moreover, a double patterning technique in which lithography is conducted two times and etching is conducted two times for obtaining a single pattern has widely been applied. The above-mentioned multilayer process has been used in each step.

On the other hand, from the viewpoint of productivity or from an economical point of view, it is desirable that a resist underlayer film forming composition is applied onto a semiconductor substrate using a spin coater to form a film. Such a resist underlayer film forming composition of an application type is required to have excellent application properties.

A resist underlayer film forming composition that enables formation of a resist underlayer film providing further improvement to the desired properties has long been awaited.

The present invention has been made for solving the above-mentioned problems. An object of the present invention is to provide a composition for forming a resist underlayer film having high etching resistance and high heat resistance as well as excellent application properties. Another object of the present invention is to provide a resist underlayer film using the above-mentioned resist underlayer film forming composition and a method for producing the same, a method for forming a resist pattern, and a method for producing a semiconductor device.

Solution to Problem

The present invention provides a resist underlayer film composition containing a novel compound that imparts such functions as high etching resistance and high heat resistance to the resultant film, and forms a resist underlayer film using the composition, for the purpose of achieving the above-mentioned properties.

The present invention embraces the followings.

[1] A resist underlayer film forming composition, comprising a compound represented by the following Formula (1):

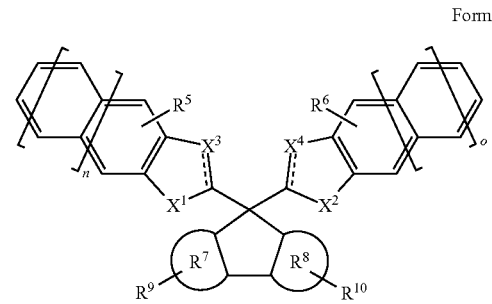

Formula (1)

wherein:

$=\!=$ represents a single bond or a double bond;
X$^1$ represents —N(R$^1$)— or —CH(R$^1$)—;
X$^2$ represents —N(R$^2$)— or —CH(R$^2$);
X$^3$ represents —N=, —CH=, —N(R$^3$)—, or —CH(R$^3$)—;
X$^4$ represents —N=, —CH=, —N(R$^4$)—, or —CH(R$^4$)—;
wherein R$^1$, R$^2$, R$^3$, and R$^4$ are the same or different, and each represents a hydrogen atom, a C1-20 linear, branched, or cyclic alkyl group, a C6-20 aryl group, a C2-10 alkenyl group, a C2-10 alkynyl group, a carboxy group, or a cyano group, wherein each of the alkyl group and aryl group is optionally substituted with a C1-6 acyl group, a C1-6 alkoxy group, a C1-6 alkoxycarbonyl group, an amino group, a glycidyl group, or a hydroxy group, and is optionally interrupted by an oxygen atom or a sulfur atom;
R$^5$, R$^6$, R$^9$, and R$^{10}$ are the same or different, and each represents a hydrogen atom, a hydroxy group, a C1-6 acyl group, a C1-6 alkoxy group, a C1-6 alkoxycarbonyl group, a C1-10 linear, branched, or cyclic alkyl group, a C6-20 aryl group, a C2-20 alkenyl group, or a C2-10 alkynyl group, wherein each of the acyl group, alkoxy group, alkoxycarbonyl group, alkyl group, aryl group, alkenyl group, and alkynyl group optionally has one or two or more groups selected from the group consisting of an amino group, a nitro group, a cyano group, a hydroxy group, a glycidyl group, and a carboxy group;

$R^7$ and $R^8$ are the same or different, and each represents a benzene ring or a naphthalene ring; and n and o are 0 or 1.

[2] The resist underlayer film forming composition according to item [1], wherein the $R^1$, $R^2$, $R^3$, or $R^4$ in Formula (1) is a hydroxy group or a C1-20 linear, branched, or cyclic alkyl group which is optionally substituted with a hydroxy group, and which is optionally interrupted by an oxygen atom or a sulfur atom.

[3] A resist underlayer film forming composition, comprising a compound containing at least one unit of one or two or more repeating units a, b, c, d, e, f, g, h, and i represented by the following Formula (2):

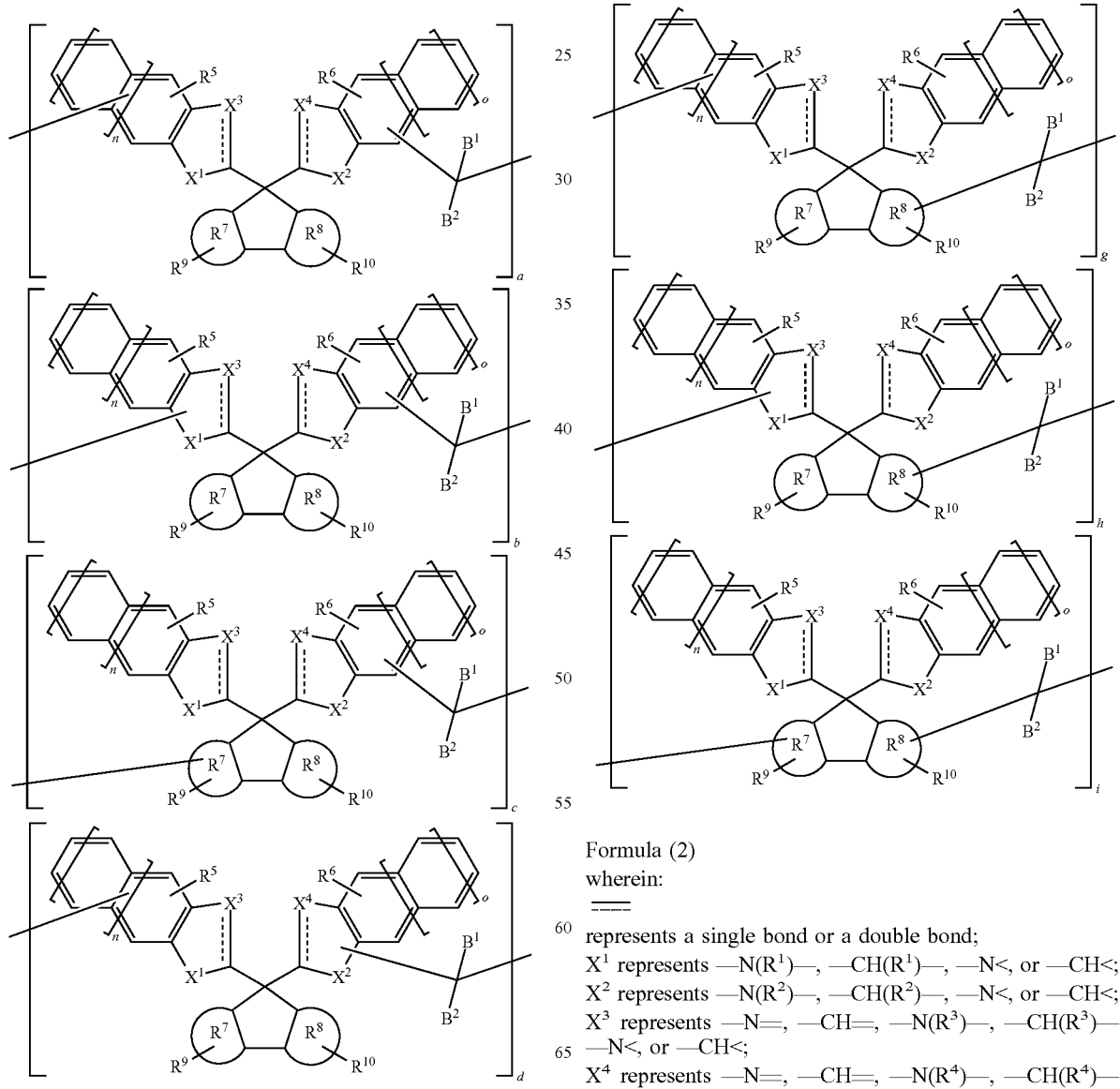

Formula (2)
wherein:
═ represents a single bond or a double bond;
$X^1$ represents —N($R^1$)—, —CH($R^1$)—, —N<, or —CH<;
$X^2$ represents —N($R^2$)—, —CH($R^2$)—, —N<, or —CH<;
$X^3$ represents —N═, —CH═, —N($R^3$)—, —CH($R^3$)—, —N<, or —CH<;
$X^4$ represents —N═, —CH═, —N($R^4$)—, —CH($R^4$)—, —N<, or —CH<;

wherein $R^1$, $R^2$, $R^3$, and $R^4$ are the same or different, and each represents a hydrogen atom, a C1-20 linear, branched, or cyclic alkyl group, a C6-20 aryl group, a C2-10 alkenyl group, a C2-10 alkynyl group, a carboxy group, or a cyano group, wherein each of the alkyl group and aryl group is optionally substituted with a C1-6 acyl group, a C1-6 alkoxy group, a C1-6 alkoxycarbonyl group, an amino group, a glycidyl group, or a hydroxy group, and is optionally interrupted by an oxygen atom or a sulfur atom;

$R^5$, $R^6$, $R^9$, and $R^{10}$ are the same or different, and each represents a hydrogen atom, a hydroxy group, a C1-6 acyl group, a C1-6 alkoxy group, a C1-6 alkoxycarbonyl group, a C1-10 linear, branched, or cyclic alkyl group, a C6-20 aryl group, a C2-20 alkenyl group, or a C2-10 alkynyl group, wherein each of the acyl group, alkoxy group, alkoxycarbonyl group, alkyl group, aryl group, alkenyl group, and alkynyl group optionally has one or two or more groups selected from the group consisting of an amino group, a nitro group, a cyano group, a hydroxy group, a glycidyl group, and a carboxy group;

$R^7$ and $R^8$ are the same or different, and each represents a benzene ring or a naphthalene ring;

n and o are 0 or 1; and $B^1$ and $B^2$ are the same or different, and each represents a hydrogen atom, a C1-20 linear, branched, or cyclic alkyl group which is optionally interrupted by an oxygen atom or a sulfur atom, or an aromatic compound derived group selected from the group consisting of a C6-40 aryl group and a C6-40 heterocyclic group, wherein $B^1$ and $B^2$ and the carbon atom to which they are bonded optionally form a ring together, and wherein the hydrogen atom of the aromatic compound derived group is optionally replaced by a C1-20 alkyl group, a phenyl group, a fused ring group, a heterocyclic group, a hydroxy group, an amino group, an ether group, an alkoxy group, a cyano group, a nitro group, or a carboxy group.

[4] A resist underlayer film forming composition, comprising a compound containing at least one unit of one or two or more repeating units j, k, l, m, r, s, t, u, v, and w represented by the following Formula (3):

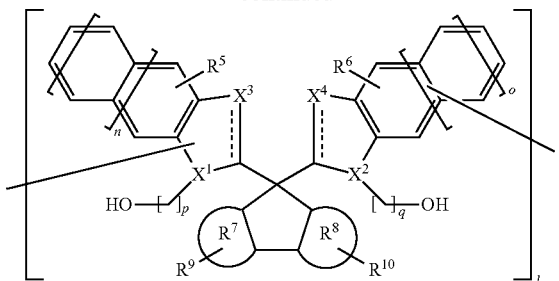

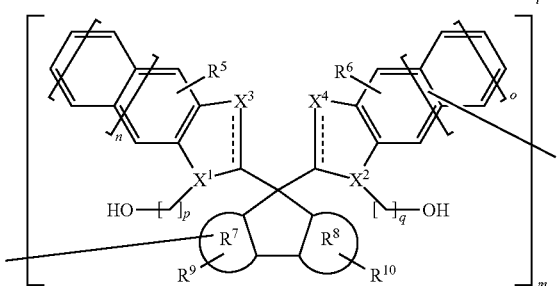

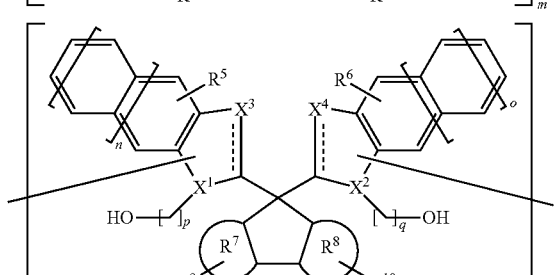

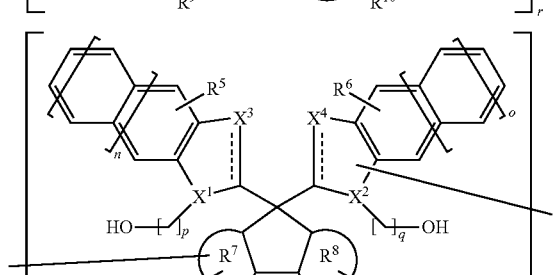

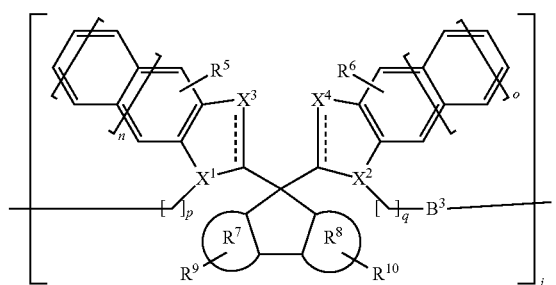

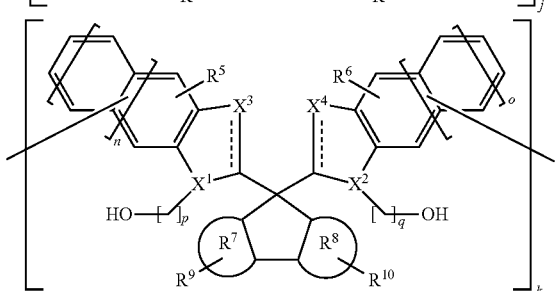

-continued

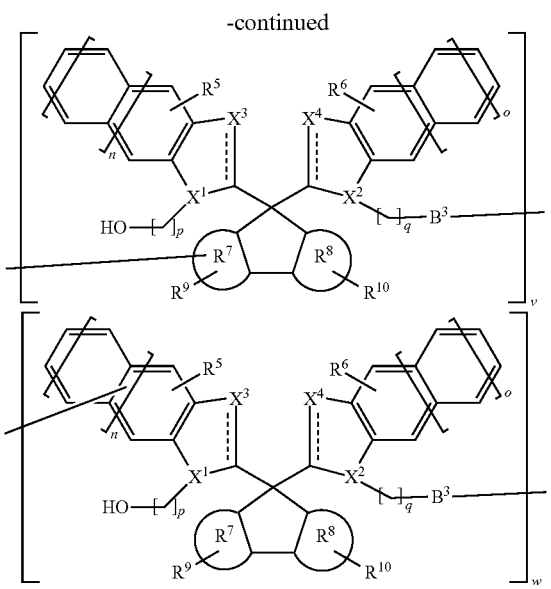

Formula (3)
wherein:
═ represents a single bond or a double bond;
X¹ represents —N< or —CH<;
X² represents —N< or —CH<;
X³ represents —N═, —CH═, —N(R³)—, or —CH(R³)—;
X⁴ represents —N═, —CH═, —N(R⁴)—, or —CH(R⁴)—;
wherein R³ and R⁴ are the same or different, and each represents a hydrogen atom, a C1-20 linear, branched, or cyclic alkyl group, a C6-20 aryl group, a C2-10 alkenyl group, a C2-10 alkynyl group, a carboxy group, or a cyano group, wherein each of the alkyl group and aryl group is optionally substituted with a C1-6 acyl group, a C1-6 alkoxy group, a C1-6 alkoxycarbonyl group, an amino group, a glycidyl group, or a hydroxy group, and is optionally interrupted by an oxygen atom or a sulfur atom;
R⁵, R⁶, R⁹, and R¹⁰ are the same or different, and each represents a hydrogen atom, a hydroxy group, a C1-6 acyl group, a C1-6 alkoxy group, a C1-6 alkoxycarbonyl group, a C1-10 linear, branched, or cyclic alkyl group, a C6-20 aryl group, a C2-20 alkenyl group, or a C2-10 alkynyl group, wherein each of the acyl group, alkoxy group, alkoxycarbonyl group, alkyl group, aryl group, alkenyl group, and alkynyl group optionally has one or two or more groups selected from the group consisting of an amino group, a nitro group, a cyano group, a hydroxy group, a glycidyl group, and a carboxy group;
R⁷ and R⁸ are the same or different, and each represents a benzene ring or a naphthalene ring;
n and o are 0 or 1;
p and q are an integer of 0 to 20,
with the proviso that, when the p quantity of methylene groups or the q quantity of methylene group are two or more, they are optionally interrupted by an oxygen atom or a sulfur atom; and
B³ represents a direct bond, or a C6-40 aromatic compound derived group which is optionally substituted with a C1-20 alkyl group, a phenyl group, a fused ring group, a heterocyclic group, a hydroxy group, an amino group, an ether group, an alkoxy group, a cyano group, a nitro group, or a carboxy group.

[5] A resist underlayer film forming composition, comprising a resin which is a reaction product of a compound of Formula (1) below and at least one aldehyde compound; a reaction product of a compound of Formula (1) below and at least one aromatic compound; or a reaction product of a compound of Formula (1) below, at least one aromatic compound, and at least one aldehyde compound:

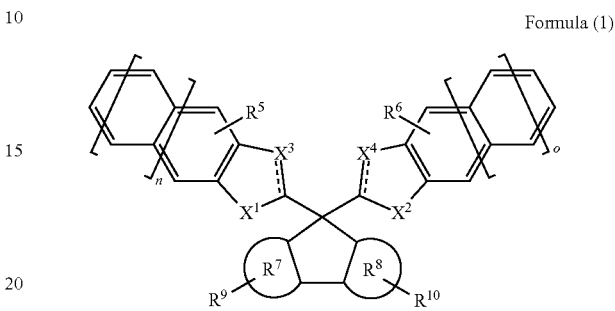

Formula (1)

wherein:
═ represents a single bond or a double bond;
X¹ represents —N(R¹)— or —CH(R¹)—;
X² represents —N(R²)— or —CH(R²);
X³ represents —N═, —CH═, —N(R³)—, or —CH(R³)—;
X⁴ represents —N═, —CH═, —N(R⁴)—, or —CH(R⁴)—;
wherein R¹, R², R³, and R⁴ are the same or different, and each represents a hydrogen atom, a C1-20 linear, branched, or cyclic alkyl group, a C6-20 aryl group, a C2-10 alkenyl group, a C2-10 alkynyl group, a carboxy group, or a cyano group, wherein each of the alkyl group and aryl group is optionally substituted with a C1-6 acyl group, a C1-6 alkoxy group, a C1-6 alkoxycarbonyl group, an amino group, a glycidyl group, or a hydroxy group, and is optionally interrupted by an oxygen atom or a sulfur atom;
R⁵, R⁶, R⁹, and R¹⁰ are the same or different, and each represents a hydrogen atom, a hydroxy group, a C1-6 acyl group, a C1-6 alkoxy group, a C1-6 alkoxycarbonyl group, a C1-10 linear, branched, or cyclic alkyl group, a C6-20 aryl group, a C2-20 alkenyl group, or a C2-10 alkynyl group, wherein each of the acyl group, alkoxy group, alkoxycarbonyl group, alkyl group, aryl group, alkenyl group, and alkynyl group optionally has one or two or more groups selected from the group consisting of an amino group, a nitro group, a cyano group, a hydroxy group, a glycidyl group, and a carboxy group;
R⁷ and R⁸ are the same or different, and each represents a benzene ring or a naphthalene ring; and
n and o are 0 or 1.

[10] The resist underlayer film forming composition according to item [5], wherein the R¹, R², R³, or R⁴ in Formula (1) is a hydroxy group or a C1-20 linear, branched, or cyclic alkyl group which is optionally substituted with a hydroxy group, and which is optionally interrupted by an oxygen atom or a sulfur atom.

[7] The resist underlayer film forming composition according to any one of items [1] to [6], further comprising a crosslinking agent.

[8] The resist underlayer film forming composition according to any one of items [1] to [7], further comprising an acid and/or an acid generator.

[9] A method for producing a resist underlayer film, comprising the step of applying the resist underlayer film forming composition according to any one of items [1] to [8] onto a semiconductor substrate and baking the applied composition.

[10] A method for producing a semiconductor device, comprising the steps of: forming on a semiconductor substrate a resist underlayer film from the resist underlayer film forming composition according to any one of items [1] to [8]; forming a resist film on the resist underlayer film; subjecting the resist film to irradiation with a light or an electron beam and development to form a resist pattern; etching the resist underlayer film with the resist pattern; and processing the semiconductor substrate using the patterned resist underlayer film.

[11] A method for producing a semiconductor device, comprising the steps of: forming on a semiconductor substrate a resist underlayer film from the resist underlayer film forming composition according to any one of items [1] to [8]; forming a hard mask on the resist underlayer film; forming a resist film on the hard mask; subjecting the resist film to irradiation with a light or an electron beam and development to form a resist pattern; etching the hard mask with the resist pattern; etching the resist underlayer film with the patterned hard mask; and processing the semiconductor substrate using the patterned resist underlayer film.

[12] A method for producing a resin for a resist underlayer film forming composition, comprising the step of: reacting a compound of Formula (1) below and at least one aldehyde compound; reacting a compound of Formula (1) below and at least one aromatic compound; or reacting a compound of Formula (1) below, at least one aromatic compound, and at least one aldehyde compound:

Formula (1)

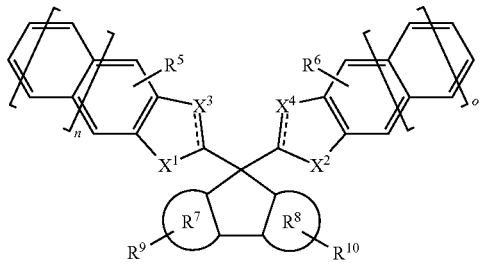

wherein:

represents a single bond or a double bond;
$X^1$ represents —N($R^1$)— or —CH($R^1$)—;
$X^2$ represents —N($R^2$)— or —CH($R^2$)—;
$X^3$ represents —N═, —CH═, —N($R^3$)—, or —CH($R^3$);
$X^4$ represents —N═, —CH═, —N($R^4$)—, or —CH($R^4$)—;
wherein $R^1$, $R^2$, $R^3$, and $R^4$ are the same or different, and each represents a hydrogen atom, a C1-20 linear, branched, or cyclic alkyl group, a C6-20 aryl group, a C2-10 alkenyl group, a C2-10 alkynyl group, a carboxy group, or a cyano group, wherein each of the alkyl group and aryl group is optionally substituted with a C1-6 acyl group, a C1-6 alkoxy group, a C1-6 alkoxycarbonyl group, an amino group, a glycidyl group, or a hydroxy group, and is optionally interrupted by an oxygen atom or a sulfur atom;
$R^5$, $R^6$, $R^9$, and $R^{10}$ are the same or different, and each represents a hydrogen atom, a hydroxy group, a C1-6 acyl group, a C1-6 alkoxy group, a C1-6 alkoxycarbonyl group, a C1-10 linear, branched, or cyclic alkyl group, a C6-20 aryl group, a C2-20 alkenyl group, or a C2-10 alkynyl group, wherein each of the acyl group, alkoxy group, alkoxycarbonyl group, alkyl group, aryl group, alkenyl group, and alkynyl group optionally has one or two or more groups selected from the group consisting of an amino group, a nitro group, a cyano group, a hydroxy group, a glycidyl group, and a carboxy group;
$R^7$ and $R^8$ are the same or different, and each represents a benzene ring or a naphthalene ring; and
n and o are 0 or 1.

Advantageous Effects of Invention

The resist underlayer film material of the present invention is advantageous not only in that it has high etching resistance and high heat resistance, but also in that it has high solubility and hence exhibits excellent spin coating properties, achieving even finer microfabrication for substrate.

Particularly, the resist underlayer film forming composition of the present invention is effective in a lithography process aiming at reducing the resist film in thickness, including the steps of forming at least two layers of resist underlayer film, and using the resist underlayer film as an etching mask.

DESCRIPTION OF EMBODIMENTS

1. Resist Underlayer Film Forming Composition

The resist underlayer film forming composition of the present invention comprises a compound represented by Formula (1) and/or a polymer derived from the compound represented by Formula (1), and preferably further comprises a crosslinking agent, an acid and/or an acid generator, a solvent, and other components. The description will be given below in order.

1.1. Compound (I) Monomer

The resist underlayer film forming composition of the present invention may comprise a compound represented by the following Formula (1):

Formula (1)

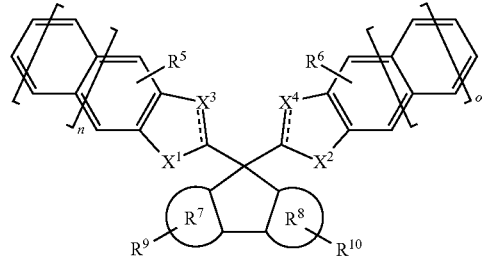

wherein:

represents a single bond or a double bond;
$X^1$ represents —N($R^1$)— or —CH($R^1$)—;
$X^2$ represents —N($R^2$)— or —CH($R^2$);
$X^3$ represents —N═, —CH═, —N($R^3$)—, or —CH($R^3$)—;
$X^4$ represents —N═, —CH═, —N($R^4$)—, or —CH($R^4$)—;
wherein — represents a bond (single bond) to one adjacent element, and ═ represents a bond (double bond) to one adjacent element;
wherein, when $R^1$, $R^2$, $R^3$, and $R^4$ are a hydrogen atom, each N is a secondary nitrogen and each C is a secondary carbon;

and, when $R^1$, $R^2$, $R^3$, and $R^4$ are not a hydrogen atom or are —N= or —CH=, each N is a tertiary nitrogen and each C is a tertiary carbon; and
wherein $R^1$, $R^2$, $R^3$, and $R^4$ are the same or different, and each represents a hydrogen atom, a C1-20 linear, branched, or cyclic alkyl group, a C6-20 aryl group, a C2-10 alkenyl group, a C2-10 alkynyl group, a carboxy group, or a cyano group, wherein each of the alkyl group and aryl group is optionally substituted with a C1-6 acyl group, a C1-6 alkoxy group, a C1-6 alkoxycarbonyl group, an amino group, a glycidyl group, or a hydroxy group, and is optionally interrupted by an oxygen atom or a sulfur atom;
$R^5$, $R^6$, $R^9$, and $R^{10}$ are the same or different, and each represents a hydrogen atom, a hydroxy group, a C1-6 acyl group, a C1-6 alkoxy group, a C1-6 alkoxycarbonyl group, a C1-10 linear, branched, or cyclic alkyl group, a C6-20 aryl group, a C2-20 alkenyl group, or a C2-10 alkynyl group, wherein each of the acyl group, alkoxy group, alkoxycarbonyl group, alkyl group, aryl group, alkenyl group, and alkynyl group optionally has one or two or more groups selected from the group consisting of an amino group, a nitro group, a cyano group, a hydroxy group, a glycidyl group, and a carboxy group;
$R^7$ and $R^8$ are the same or different, and each represents a benzene ring or a naphthalene ring; and
n and o are 0 or 1.

In Formula (1),

=== is preferably a double bond.

It is preferred that at least one of $X^1$, $X^2$, $X^3$, and $X^4$ contains a nitrogen atom.

$X^1$ preferably represents —N($R^1$)—. $X^2$ preferably represents —N($R^2$)—. $X^3$ preferably represents —CH=. $X^4$ preferably represents —CH=.

In $R^1$, $R^2$, $R^3$, $R^4$, $R^5$, $R^6$, $R^9$, and $R^{10}$, examples of C1-6 acyl groups include a formyl group, an acetyl group, a propionyl group, a butyryl group, an isobutyryl group, a valeryl group, and an isovaleryl group.

Examples of C1-6 alkoxy groups include a methoxy group, an ethoxy group, a n-propoxy group, an isopropoxy group, a n-butoxy group, an isobutoxy group, a tert-butoxy group, a sec-butoxy group, a n-pentoxy group, a neopentoxy group, a n-hexyloxy group, an isohexyloxy group, and a 3-methylpentoxy group, and preferred is a methoxy group or an ethoxy group.

Examples of C1-6 alkoxycarbonyl groups include a methoxycarbonyl group, an ethoxycarbonyl group, a n-propoxycarbonyl group, an i-propoxycarbonyl group, a n-butoxycarbonyl group, an i-butoxycarbonyl group, a sec-butoxycarbonyl group, a tert-butoxycarbonyl group, a n-pentyloxycarbonyl group, and a n-hexyloxycarbonyl group, and preferred is a methoxycarbonyl group or an ethoxycarbonyl group.

Examples of the alkyl groups in the "C1-20 linear, branched, or cyclic alkyl group which is optionally substituted with an amino group, a glycidyl group, or a hydroxy group, and which is optionally interrupted by an oxygen atom or a sulfur atom" and "C1-10 linear, branched, or cyclic alkyl group" include linear alkyl groups, such as a methyl group, an ethyl group, a n-propyl group, a n-butyl group, a n-pentyl group, a n-hexyl group, a n-heptyl group, a n-octyl group, a n-nonyl group, and a n-decyl group; branched alkyl groups, such as an isopropyl group, a sec-butyl group, a tert-butyl group, an isopentyl group, a neopentyl group, a 1-methylpentyl group, an isohexyl group, a 1-propylbutyl group, a 2-ethylhexyl group, and an isononyl group; and cyclic alkyl groups, such as a cyclopropyl group, a cyclobutyl group, a cyclopentyl group, a cyclohexyl group, a p-tert-butylcyclohexyl group, and an adamantyl group; and preferred are a methyl group, an ethyl group, a n-propyl group, a n-butyl group, an isopropyl group, a sec-butyl group, and a tert-butyl group; and more preferred are a methyl group, an ethyl group, an isopropyl group, a sec-butyl group, and a tert-butyl group.

Examples of C1-20 alkyl groups interrupted by an oxygen atom or a sulfur atom include alkyl groups containing a structural unit —$CH_2$—O— or —$CH_2$—S—. The alkyl group may contain one or two or more units of —O— or —S—. Specific examples of C1-20 alkyl groups interrupted by an —O— or —S— unit include a methoxy group, an ethoxy group, a propoxy group, a butoxy group, a methylthio group, an ethylthio group, a propylthio group, and a butylthio group; as well as a methyl group, an ethyl group, a propyl group, a butyl group, a pentyl group, a hexyl group, a heptyl group, an octyl group, a nonyl group, a decyl group, a dodecyl group, and an octadecyl group, each of which is substituted with a methoxy group, an ethoxy group, a propoxy group, a butoxy group, a methylthio group, an ethylthio group, a propylthio group, or a butylthio group. Preferred are a methoxy group, an ethoxy group, a methylthio group, and an ethylthio group; and more preferred are a methoxy group and an ethoxy group.

Examples of C6-20 aryl groups include a phenyl group, a naphthyl group, a biphenyl group, an anthracyl group, a phenanthryl group, and a pyrenyl group; and preferred is a phenyl group, a naphthyl group, or a biphenyl group.

Examples of C2-10 or C2-20 alkenyl groups include a vinyl group, a propenyl group, and a butenyl group; and preferred is a vinyl group.

Examples of C2-10 alkynyl groups include ethynyl, propynyl, butynyl, pentynyl, hexynyl, heptynyl, octynyl, nonynyl, decynyl, butadiynyl, pentadiynyl, hexadiynyl, heptadiynyl, octadiynyl, nonadiynyl, and decadiynyl groups; and preferred are ethynyl, propynyl, and butynyl.

$R^1$, $R^2$, $R^3$, and $R^4$ are preferably a hydroxy group or a C1-20 linear, branched, or cyclic alkyl group which is optionally substituted with a hydroxy group, and which is optionally interrupted by an oxygen atom or a sulfur atom; preferably a hydroxy group or a C1-20 linear, branched, or cyclic alkyl group which is optionally substituted with a hydroxy group.

Preferred examples of the compounds represented by Formula (1) areas follows.

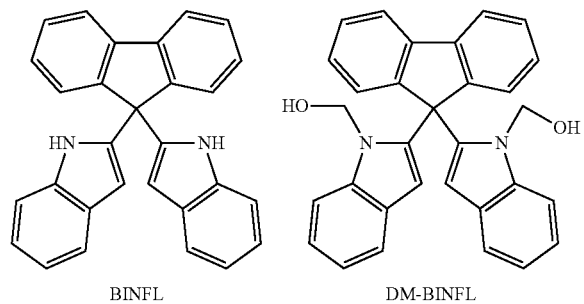

BINFL                    DM-BINFL 1.2. Compound (II) Polymer

The resist underlayer film forming composition of the present invention may contain the compound represented by Formula (1), and in addition thereto or, instead thereof, a polymer derived from the compound represented by Formula (1).

Examples of the polymers derived from the compound represented by Formula (1) include compounds containing at least one unit of one or two or more repeating units a, b, c, d, e, f, g, h, and i represented by the following Formula (2):

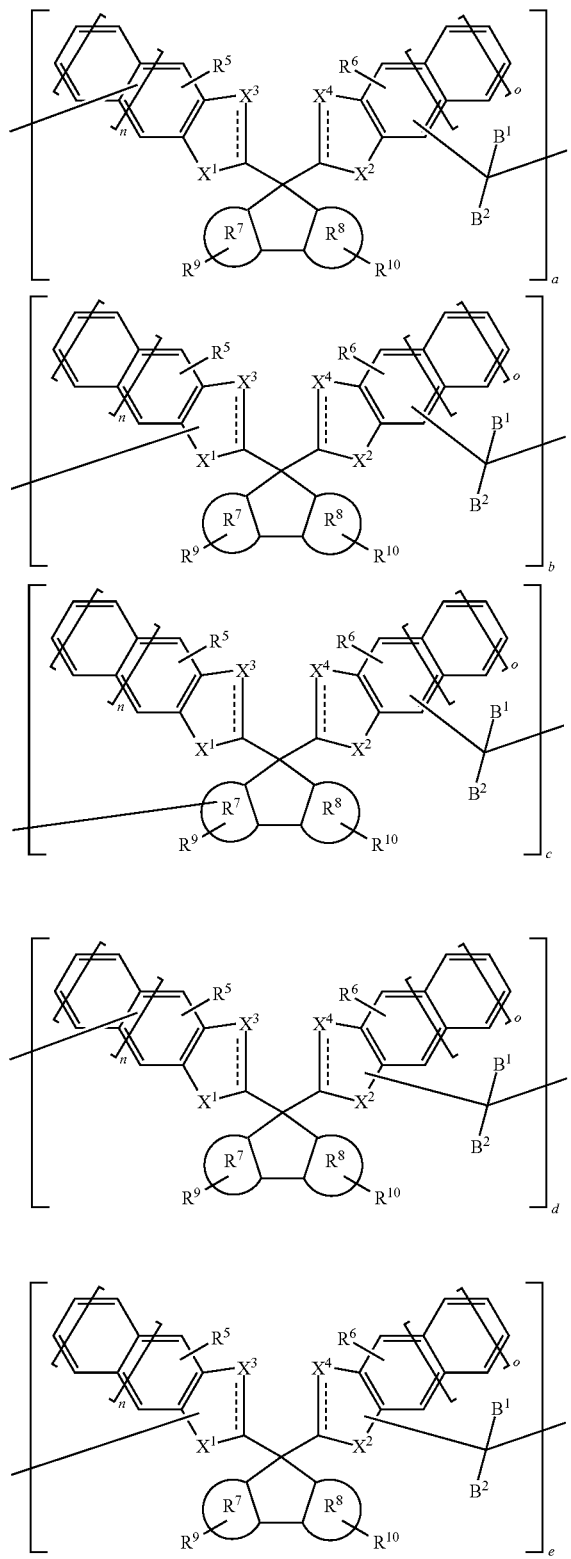

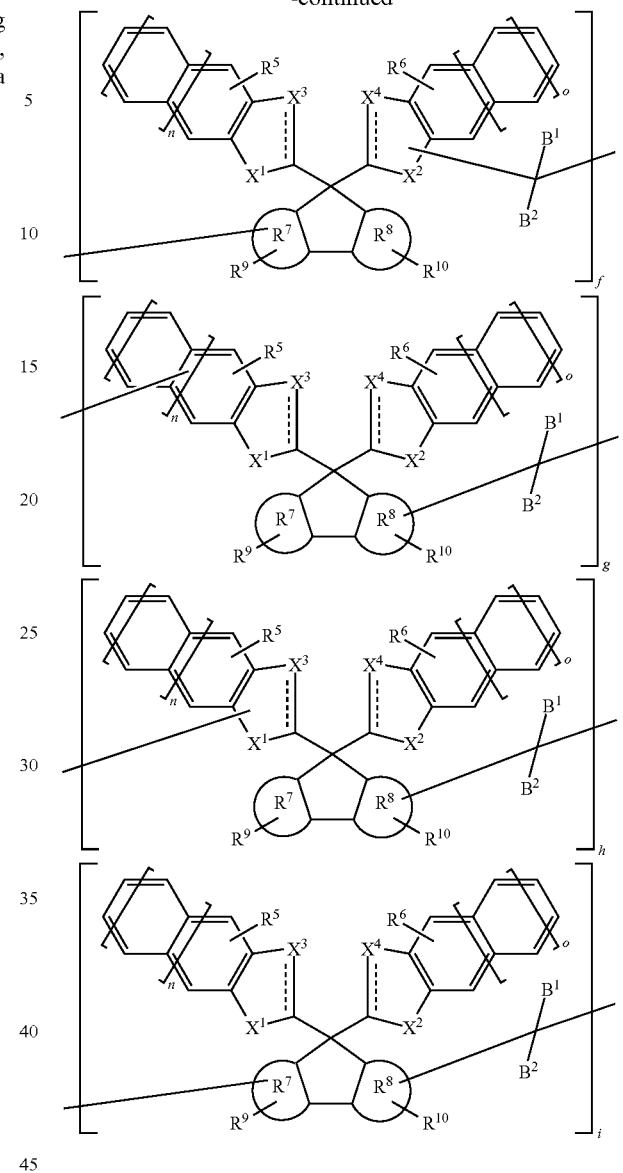

Formula (2)
wherein:

═══ represents a single bond or a double bond;

$X^1$ represents —N($R^1$)—, —CH($R^1$)—, —N<, or —CH<;
$X^2$ represents —N($R^2$)—, —CH($R^2$)—, —N<, or —CH;
$X^3$ represents —N═, —CH═, —N($R^3$)—, —CH($R^3$)—, —N<, or —CH<;
$X^4$ represents —N═, —CH═, —N($R^4$)—, —CH($R^4$)—, —N<, or —CH<;

wherein — represents a bond (single bond) to one adjacent element, ═ represents a bond (double bond) to one adjacent element, and < represents two bonds (two single bonds) each binding to two adjacent elements;

wherein, when $R^1$, $R^2$, $R^3$, and $R^4$ are a hydrogen atom, each N is a secondary nitrogen and each C is a secondary carbon; and, when $R^1$, $R^2$, $R^3$, and $R^4$ are not a hydrogen atom or are —N═, —CH═, —N<, or —CH<, each N is a tertiary nitrogen and each C is a tertiary carbon; and wherein $R^1$, $R^2$, $R^3$, and $R^4$ are the same or different, and each represents a hydrogen atom, a C1-20 linear, branched, or cyclic alkyl group, a C6-20 aryl group, a C2-10 alkenyl group, a C2-10 alkynyl group, a carboxy group, or a cyano group, wherein each of the alkyl group and aryl group is optionally substituted with a C1-6 acyl group, a C1-6 alkoxy group, a C1-6 alkoxycarbonyl group, an amino group, a glycidyl group, or a hydroxy group, and is optionally interrupted by an oxygen atom or a sulfur atom;

$R^5$, $R^6$, $R^9$, and $R^{10}$ are the same or different, and each represents a hydrogen atom, a hydroxy group, a C1-6 acyl group, a C1-6 alkoxy group, a C1-6 alkoxycarbonyl group, a C1-10 linear, branched, or cyclic alkyl group, a C6-20 aryl group, a C2-20 alkenyl group, or a C2-10 alkynyl group, wherein each of the acyl group, alkoxy group, alkoxycarbonyl group, alkyl group, aryl group, alkenyl group, and alkynyl group optionally has one or two or more groups selected from the group consisting of an amino group, a nitro group, a cyano group, a hydroxy group, a glycidyl group, and a carboxy group;

$R^7$ and $R^8$ are the same or different, and each represents a benzene ring or a naphthalene ring;

n and o are 0 or 1; and $B^1$ and $B^2$ are the same or different, and each represents a hydrogen atom, a C1-20 linear, branched, or cyclic alkyl group which is optionally interrupted by an oxygen atom or a sulfur atom, or an aromatic compound derived group selected from the group consisting of a C6-40 aryl group and a C6-40 heterocyclic group, wherein $B^1$ and $B^2$ and the carbon atom to which they are bonded optionally form a ring together, and wherein the hydrogen atom of the aromatic compound derived group is optionally replaced by a C1-20 alkyl group, a phenyl group, a fused ring group, a heterocyclic group, a hydroxy group, an amino group, an ether group, an alkoxy group, a cyano group, a nitro group, or a carboxy group.

Preferred embodiments and specific examples for the definition of Formula (2) are the similar as described above.

In the definition of $B^1$ and $B^2$, the C6-40 aryl group and C6-40 heterocyclic group may be (a) a monocycle derived group, such as benzene, (b) a fused ring derived group, such as naphthalene, (c) a heterocycle derived group, such as furan, thiophene, or pyridine, (d) a group obtained by bonding the aromatic rings from (a) to (c) through a single bond, such as biphenyl, or (e) a compound obtained by linking the aromatic rings from (a) to (d) through a spacer, such as —CH—, —(CH$_2$)$_n$— (n=1 to 20), —CH═CH—, —CH≡CH—, —N═N—, —NH—, —NHR—, —NHCO—, —NRCO—, —S—, —COO—, —O—, —CO—, or —CH═N—.

Preferred aromatic rings are a benzene ring, a thiophene ring, a furan ring, a pyridine ring, a pyrimidine ring, a pyrazine ring, a pyrrole ring, an oxazole ring, a thiazole ring, an imidazole ring, a naphthalene ring, an anthracene ring, a quinoline ring, a carbazole ring, a quinazoline ring, a purine ring, an indolizine ring, a benzothiophene ring, a benzofuran ring, an indole ring, and an acridine ring.

More preferred aromatic rings are a benzene ring, a thiophene ring, a furan ring, a pyridine ring, a pyrimidine ring, a pyrrole ring, an oxazole ring, a thiazole ring, an imidazole ring, and a carbazole ring.

The above-mentioned aromatic ring may be linked to another one through a single bond or a spacer.

Examples of the spacers include —CH—, —(CH$_2$)$_n$— (n=1 to 20), —CH═CH—, —CH≡CH—, —N═N—, —NH—, —NHR—, —NHCO—, —NRCO—, —S—, —COO—, —O—, —CO—, and —CH═N—, and a combination thereof. Two or more spacers may be linked together.

The fused ring group refers to a substituent derived from a fused ring compound. Specific examples thereof include a phenyl group, a naphthyl group, an anthracenyl group, a phenanthrenyl group, a naphthacenyl group, a triphenylenyl group, a pyrenyl group, and a chrysenyl group. Of these, preferred are a phenyl group, a naphthyl group, an anthracenyl group, and a pyrenyl group.

The heterocyclic group refers to a substituent derived from a heterocyclic compound. Specific examples thereof include a thiophene group, a furan group, a pyridine group, a pyrimidine group, a pyrazine group, a pyrrole group, an oxazole group, a thiazole group, an imidazole group, a quinoline group, a carbazole group, a quinazoline group, a purine group, an indolizine group, a benzothiophene group, a benzofuran group, an indole group, an acridine group, an isoindole group, a benzimidazole group, an isoquinoline group, a quinoxaline group, a cinnoline group, a pteridine group, a chromene group (benzopyran group), an isochromene group (benzopyran group), a xanthene group, a thiazole group, a pyrazole group, an imidazoline group, and an azine group. Of these, preferred are a thiophene group, a furan group, a pyridine group, a pyrimidine group, a pyrazine group, a pyrrole group, an oxazole group, a thiazole group, an imidazole group, a quinoline group, a carbazole group, a quinazoline group, a purine group, an indolizine group, a benzothiophene group, a benzofuran group, an indole group, and an acridine group. Most preferred are a thiophene group, a furan group, a pyridine group, a pyrimidine group, a pyrrole group, an oxazole group, a thiazole group, an imidazole group, and a carbazole group.

Further, examples of the polymers derived from the compound represented by Formula (1) include compounds containing at least one unit of one or two or more repeating units j, k, l, m, r, s, t, u, v, and w represented by Formula (3):

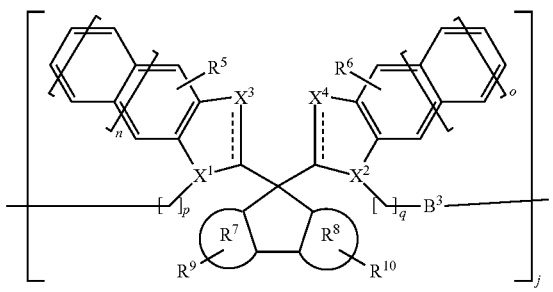

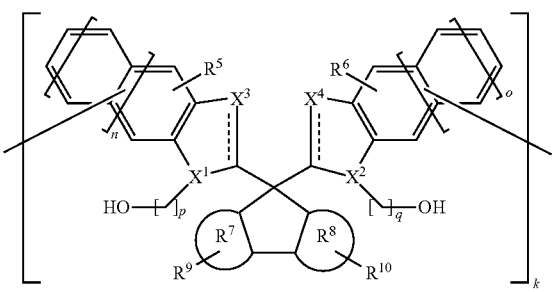

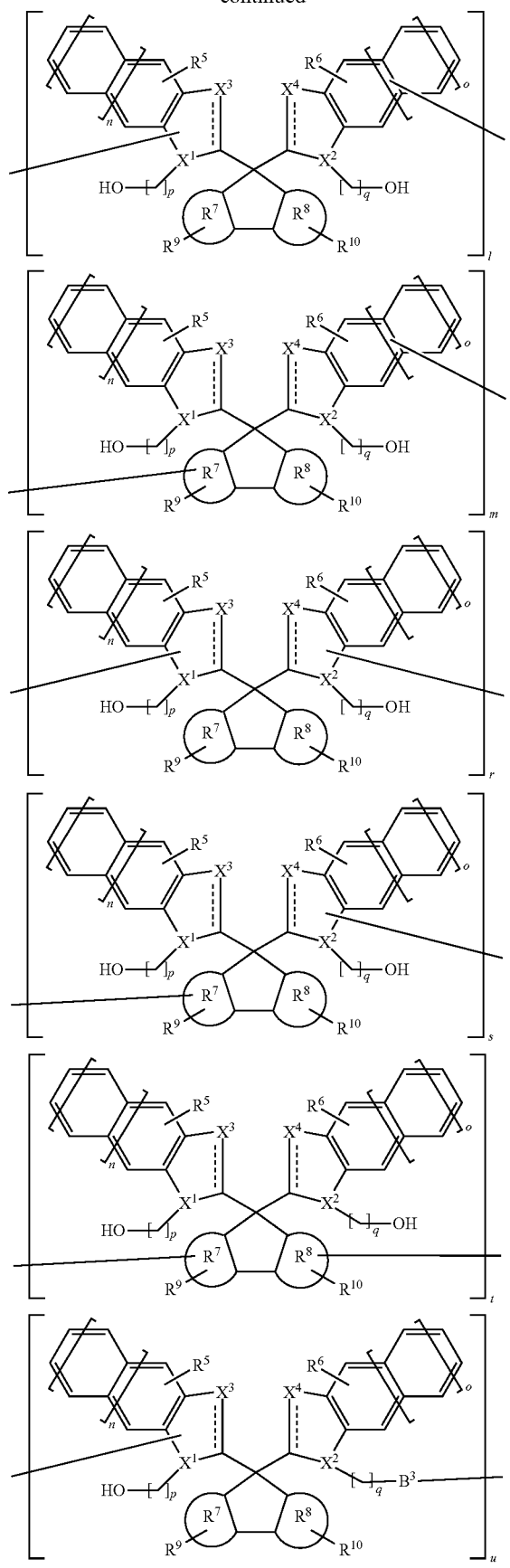

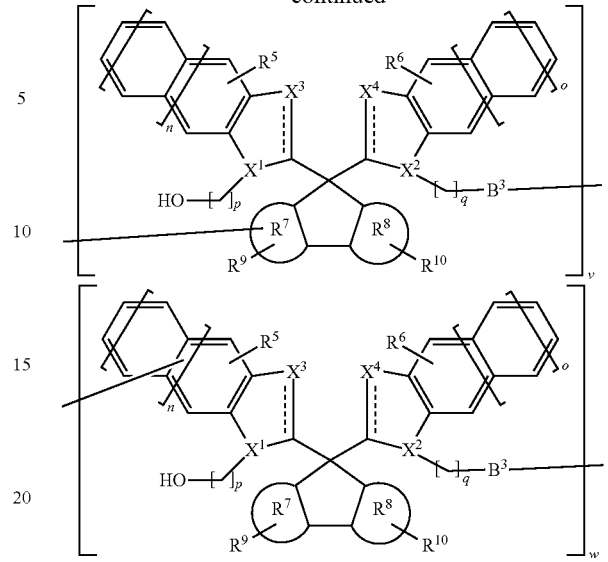

Formula (3)
wherein:

=== represents a single bond or a double bond;
$X^1$ represents —N< or —CH<;
$X^2$ represents —N< or —CH<;
$X^3$ represents —N=, —CH=, —N($R^3$)—, or —CH($R^3$)—;
$X^4$ represents —N=, —CH=, —N($R^4$)—, or —CH($R^4$)—;
wherein $R^3$ and $R^4$ are the same or different, and each represents a hydrogen atom, a C1-20 linear, branched, or cyclic alkyl group, a C6-20 aryl group, a C2-10 alkenyl group, a C2-10 alkynyl group, a carboxy group, or a cyano group, wherein each of the alkyl group and aryl group is optionally substituted with a C1-6 acyl group, a C1-6 alkoxy group, a C1-6 alkoxycarbonyl group, an amino group, a glycidyl group, or a hydroxy group, and is optionally interrupted by an oxygen atom or a sulfur atom;
$R^5$, $R^6$, $R^9$, and $R^{10}$ are the same or different, and each represents a hydrogen atom, a hydroxy group, a C1-6 acyl group, a C1-6 alkoxy group, a C1-6 alkoxycarbonyl group, a C1-10 linear, branched, or cyclic alkyl group, a C6-20 aryl group, a C2-20 alkenyl group, or a C2-10 alkynyl group, wherein each of the acyl group, alkoxy group, alkoxycarbonyl group, alkyl group, aryl group, alkenyl group, and alkynyl group optionally has one or two or more groups selected from the group consisting of an amino group, a nitro group, a cyano group, a hydroxy group, a glycidyl group, and a carboxy group;
$R^7$ and $R^8$ are the same or different, and each represents a benzene ring or a naphthalene ring;
n and o are 0 or 1;
p and q are an integer of 0 to 20;
with the proviso that, when the p quantity of methylene groups or the q quantity of methylene group are two or more, they are optionally interrupted by an oxygen atom or a sulfur atom; and
$B^3$ represents a direct bond, or a C6-40 aromatic compound derived group which is optionally substituted with a C1-20 alkyl group, a phenyl group, a fused ring group, a heterocyclic group, a hydroxy group, an amino group, an ether group, an alkoxy group, a cyano group, a nitro group, or a carboxy group.

Preferred embodiments and specific examples for the definition of Formula (3) are the similar as described above.

1.3. Method for Producing Polymer

The resin for the resist underlayer film forming composition of the present invention may be produced by a method comprising the step of: reacting a compound of Formula (1) above and at least one aldehyde compound; reacting a compound of Formula (1) above and at least one aromatic compound; or reacting a compound of Formula (1) above, at least one aromatic compound, and at least one aldehyde compound.

Examples of the aldehyde compounds include formaldehyde, paraformaldehyde, acetaldehyde, trioxane, propionaldehyde, butylaldehyde, trimethylacetaldehyde, acrolein, crotonaldehyde, cyclohexanealdehyde, furfural, furylacrolein, benzaldehyde, terephthalaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-methylbenzaldehyde, m-methylbenzaldehyde, p-methylbenzaldehyde, o-chlorobenzaldehyde, m-chlorobenzaldehyde, p-chlorobenzaldehyde, and cinnamaldehyde. These aldehyde compounds may be used alone or in combination. Preferably not more than three aldehyde compounds, more preferably not more than two aldehyde compounds are used in combination.

The aromatic compound is preferably a C6-40 aromatic compound, which results in a divalent group —C($B^1$)($B^2$)— or —$B^3$—. It is one of the components constituting the polymer of Formula (2) or (3) above. The aromatic compound may be (a) a monocyclic compound, such as benzene, (b) a fused ring compound, such as naphthalene, (c) a heterocyclic compound, such as furan, thiophene, or pyridine, (d) a compound obtained by bonding the aromatic rings from (a) to (c) through a single bond, such as biphenyl, or (e) a compound obtained by linking the aromatic rings from (a) to (d) through a spacer, such as —CH—, —(CH$_2$)$_n$— (n=1 to 20), —CH=CH—, —CH≡CH—, —N=N—, —NH—, —NHR—, —NHCO—, —NRCO—, —S—, —COO—, —O—, —CO—, or —CH=N—.

Examples of the aromatic compounds include benzene, thiophene, furan, pyridine, pyrimidine, pyrazine, pyrrole, oxazole, thiazole, imidazole, naphthalene, anthracene, quinoline, carbazole, quinazoline, purine, indolizine, benzothiophene, benzofuran, indole, and acridine.

Preferred is an aromatic amine or a phenolic hydroxy group-containing compound.

Examples of the aromatic amines include phenylindole and phenylnaphthylamine.

Examples of the phenolic hydroxy group-containing compounds include phenol, dihydroxybenzene, trihydroxybenzene, hydroxynaphthalene, dihydroxynaphthalene, trihydroxynaphthalene, tris(4-hydroxyphenyl)methane, tris(4-hydroxyphenyl)ethane, and 1,1,2,2-tetrakis(4-hydroxyphenyl)ethane.

The hydrogen atom of the C6-40 aromatic compound may be replaced by a C1-20 alkyl group, a phenyl group, a fused ring group, a heterocyclic group, a hydroxy group, an amino group, an ether group, an alkoxy group, a cyano group, a nitro group, or a carboxy group.

The divalent group is preferably a divalent group derived from a C6-40 arylamine compound.

The above-mentioned aromatic compound may be linked to another one through a single bond or a spacer.

Examples of the spacers include —CH—, —(CH$_2$)$_n$— (n=1 to 20), —CH=CH—, —CH≡CH—, —N=N—, —NH—, —NHR—, —NHCO—, —NRCO—, —S—, —COO—, —O—, —CO—, and —CH=N—, and a combination thereof. Two or more spacers may be linked together.

The above-mentioned divalent group may be a divalent group derived from an aromatic compound containing an amino group, a hydroxy group, or both. And, the divalent group may be a divalent group derived from an aromatic compound containing an aryl amine compound, a phenol compound, or both. More specifically, the divalent group may be a divalent group derived from aniline, diphenylamine, phenylnaphthylamine, hydroxydiphenylamine, carbazole, phenol, N,N'-diphenylethylenediamine, N,N'-diphenyl-1,4-phenylenediamine, or a polynuclear phenol.

Examples of the polynuclear phenols include dihydroxybenzene, trihydroxybenzene, hydroxynaphthalene, dihydroxynaphthalene, trihydroxynaphthalene, tris(4-hydroxyphenyl)methane, tris(4-hydroxyphenyl)ethane, 2,2'-biphenol, and 1,1,2,2-tetrakis(4-hydroxyphenyl)ethane.

These aromatic compounds can be used alone or in combination. Preferably not more than three aromatic compounds, more preferably not more than two aromatic compounds are used in combination.

$B^1$, $B^2$, and $B^3$ may be freely selected within the above-mentioned scope. It is desirable, however, that they are selected so that the resultant polymer be satisfactorily dissolved in the above-mentioned solvent used in the present invention and provide a resist underlayer film forming composition that is passable through a microfilter having a pore diameter of 0.1 μm.

As an acid catalyst to be used in the reaction, for example, a mineral acid, such as sulfuric acid, phosphoric acid, or perchloric acid; an organic sulfonic acid, such as p-toluenesulfonic acid, p-toluenesulfonic acid monohydrate, or methanesulfonic acid; or a carboxylic acid, such as formic acid or oxalic acid; is used. The amount of the acid catalyst used is appropriately selected depending on the type of the acid used. It usually ranges 0.001 to 10,000 parts by mass, preferably 0.01 to 1,000 parts by mass, more preferably 0.1 to 100 parts by mass, relative to 100 parts by mass of the aromatic compound.

Although the above-mentioned condensation reaction and addition reaction may be conducted without a solvent, they are usually conducted using a solvent. Any solvent may be used as long as it does not inhibit the reaction. Examples of the solvents include ethers, such as 1,2-dimethoxyethane, diethylene glycol dimethyl ether, propylene glycol monomethyl ether, tetrahydrofuran, and dioxane.

The reaction temperature usually ranges 40 to 200° C. The reaction time may be appropriately selected according to the reaction temperature, and usually within the range of about 30 minutes to 50 hours.

The polymer obtained as mentioned above usually has a weight average molecular weight Mw of 500 to 2,000,000, or 600 to 100,000, or 700 to 10,000, or 800 to 8,000, or 900 to 6,000.

As the result of the polymerization reaction, a polymer containing repeating units represented by Formula (2) or Formula (3) above is obtained, as well as a polymer mixture having the compound of Formula (1), an aromatic compound, and an aldehyde compound that are complicatedly bonded to each other. For this reason, it is not necessarily practical to directly specify the polymer by its structure.

1.4. Crosslinking Agent

The resist underlayer film forming composition of the present invention may contain a crosslinking agent component. Particularly, when the compound of Formula (1) above is a monomer, it is preferable to use a crosslinking agent component. Examples of the crosslinking agent include melamines, substituted ureas, and polymers thereof. Preferred are crosslinking agents having at least two crosslink-forming substituents, and examples include such compounds as methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, and methoxymethylated thiourea. Condensation products of the above compounds may be used.

As the crosslinking agent, a crosslinking agent having high heat resistance may be used. As the crosslinking agent having high heat resistance, it is preferable to use a compound containing in the molecule thereof a crosslink-forming substituent having an aromatic ring (for example, a benzene ring or a naphthalene ring).

Examples of such compounds include compounds having a partial structure of the following Formula (4), and polymers or oligomers having repeating units of the following Formula (5).

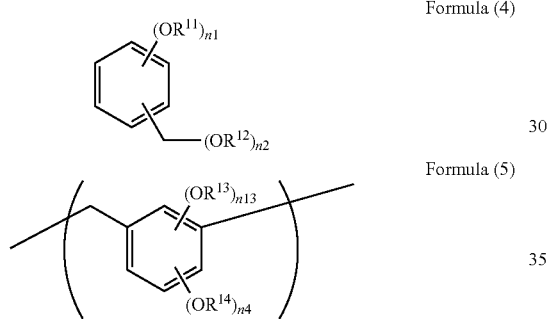

Formula (4)

Formula (5)

In the above Formulae, $R^{11}$, $R^2$, $R^{13}$, and $R^{14}$ are a hydrogen atom or an alkyl group having 1 to 10 carbon atoms, and, as the alkyl group, those mentioned above as examples of the alkyl groups may be used.

Each of n1 and n2 represents an integer of 0 to 6, and each of n3 and n4 represents an integer of 0 to 4.

Examples of the compounds, polymers, and oligomers of Formulae (4) and (5) include the followings.

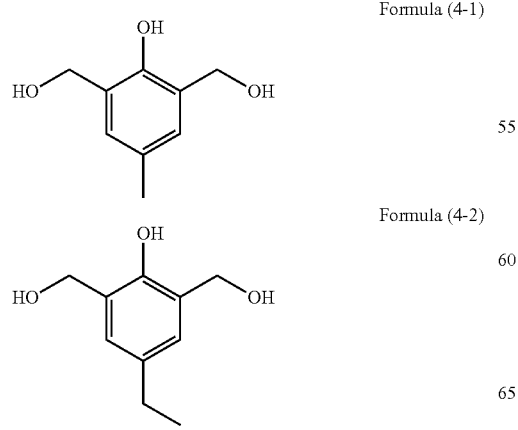

Formula (4-1)

Formula (4-2)

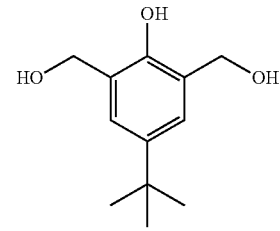

Formula (4-3)

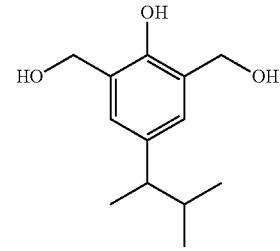

Formula (4-4)

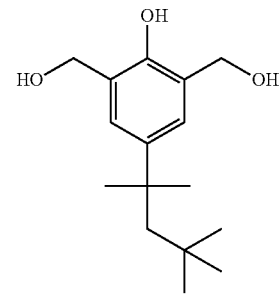

Formula (4-5)

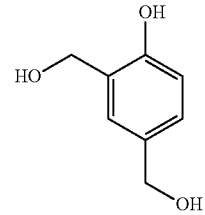

Formula (4-6)

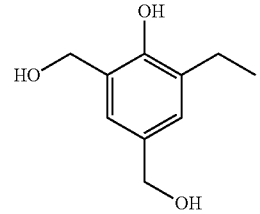

Formula (4-7)

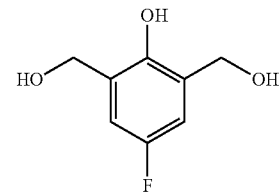

Formula (4-8)

Formula (4-9)
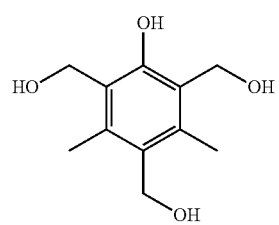
Formula (4-10)
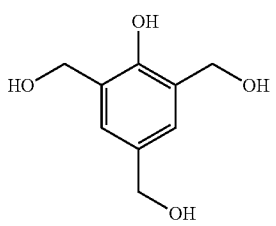
Formula (4-11)
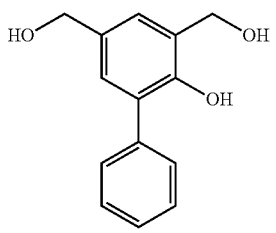
Formula (4-12)
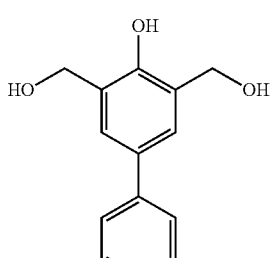
Formula (4-13)
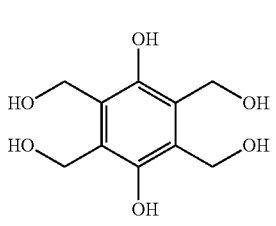
Formula (4-14)
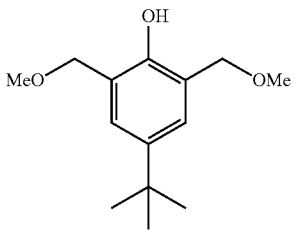
Formula (4-15)
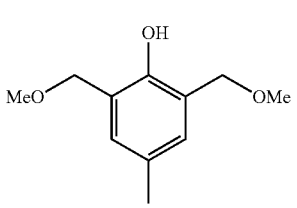
Formula (4-16)
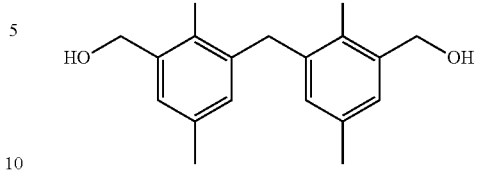
Formula (4-17)
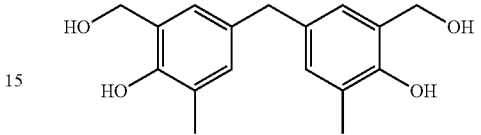
Formula (4-18)
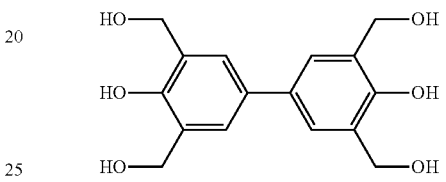
Formula (4-19)
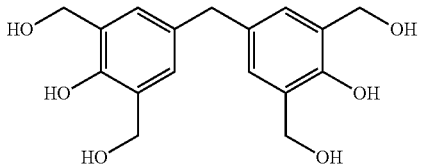
Formula (4-20)
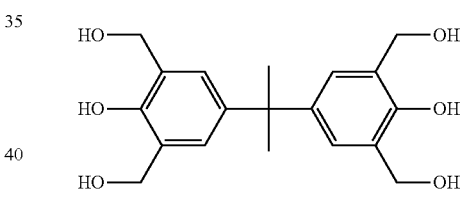
Formula (4-21)
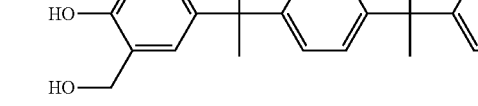
Formula (4-22)
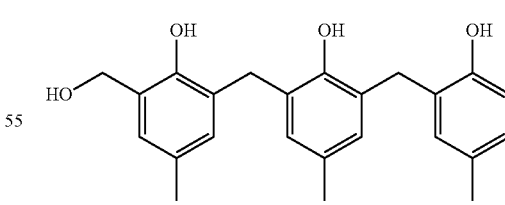
Formula (4-23)
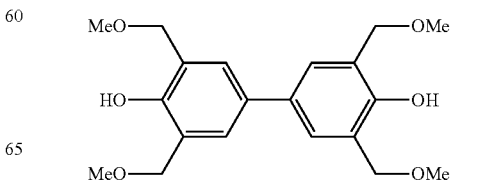

-continued

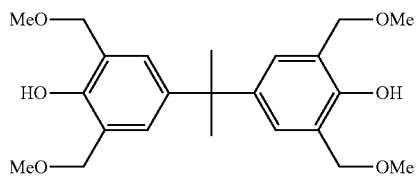

Formula (4-24)

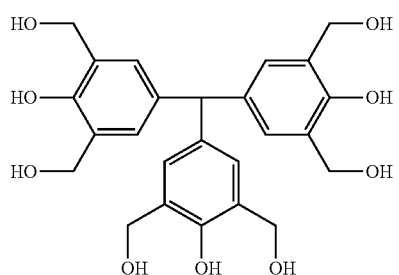

Formula (4-25)

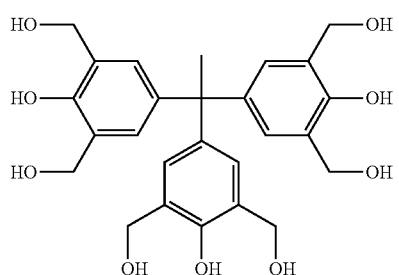

Formula (4-26)

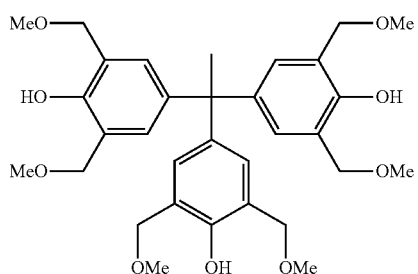

Formula (4-27)

The above-mentioned compounds are available as products of Asahi Yukizai Corporation and Honshu Chemical Industry Co., Ltd. For example, of the above-mentioned crosslinking agents, the compound of Formula (4-23) is available under the trade name: TMOM-BP (manufactured by Honshu Chemical Industry Co., Ltd.), and the compound of Formula (4-24) is available under the trade name: TM-BIP-A (manufactured by Asahi Yukizai Corporation).

Although the amount of the crosslinking agent added varies depending on, for example, the application solvent used, the substrate used, the required solution viscosity, and the required film form, it may range 0.001 to 80% by mass, preferably 0.01 to 50% by mass, more preferably 0.05 to 40% by mass, based on the mass of the total solid. The crosslinking agent may possibly cause a crosslinking reaction due to self-condensation. However, the presence of a crosslinkable substituent in the above-mentioned polymer in the present invention would be able to cause a crosslinking reaction between the crosslinking agent and the crosslinkable substituent.

1.5. Acid and Acid Generator

In the present invention, as a catalyst for accelerating the crosslinking reaction, an acid and/or an acid generator may be added. For example, an acid compound, such as p-toluenesulfonic acid, trifluoromethanesulfonic acid, pyridinium p-toluenesulfonate, salicylic acid, 5-sulfosalicylic acid, 4-phenolsulfonic acid, camphorsulfonic acid, 4-chlorobenzenesulfonic acid, benzenedisulfonic acid, 1-naphthalenesulfonic acid, citric acid, benzoic acid, hydroxybenzoic acid, and naphthalenecarboxyic acid; and/or 2,4,4,6-tetrabromocyclohexadienone, benzoin tosylate, 2-nitrobenzyl tosylate, a pyridinium salt compound, such as pyridinium p-hydroxybenzenesulfonate, pyridinium p-toluenesulfonate, and pyridinium trifluoromethanesulfonate; or a thermal acid generator, such as an organic sulfonic acid alkyl ester, may be incorporated. The amount of the acid or acid generator incorporated may range 0.0001 to 20% by mass, preferably 0.0005 to 10% by mass, further preferably 0.01 to 3% by mass, based on the mass of the total solid of the composition.

The resist underlayer film forming composition of the present invention may contain an acid generator.

Examples of the acid generators include a thermal acid generator and a photo-acid generator.

The photo-acid generator generates an acid upon the exposure for the resist. Therefore, it is possible to control the acidity of the resist underlayer film. This is a method for making the acidity of the resist underlayer film consistent with the acidity of the resist as an upper layer. Further, by controlling the acidity of the resist underlayer film, the pattern form for a resist formed as an upper layer can be controlled.

Examples of the photo-acid generators contained in the resist underlayer film forming composition of the present invention include onium salt compounds, sulfonimide compounds, and disulfonyldiazomethane compounds.

Examples of the onium salt compounds include iodonium salt compounds, such as diphenyliodonium hexafluorophosphate, diphenyliodonium trifluoromethanesulfonate, diphenyliodonium nonafluoronormalbutanesulfonate, diphenyliodonium perfluoronormaloctanesulfonate, diphenyliodonium camphorsulfonate, bis(4-tert-butylphenyl)iodonium camphorsulfonate, and bis(4-tert-butylphenyl)iodonium trifluoromethanesulfonate; and sulfonium salt compounds, such as triphenylsulfonium hexafluoroantimonate, triphenylsulfonium nonafluoronormalbutanesulfonate, triphenylsulfonium camphorsulfonate, and triphenylsulfonium trifluoromethanesulfonate.

Examples of the sulfonimide compounds include N-(trifluoromethanesulfonyloxy)succinimide, N-(nonafluoronormalbutanesulfonyloxy)succinimide, N-(camphorsulfonyloxy)succinimide, and N-(trifluoromethanesulfonyloxy) naphthalimide.

Examples of the disulfonyldiazomethane compounds include bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethane, and methylsulfonyl-p-toluenesulfonyldiazomethane.

The photo-acid generators may be used alone or in combination.

When a photo-acid-generator is used, the amount of the photo-acid generator may range 0.01 to 5 parts by mass, or 0.1 to 3 parts by mass, or 0.5 to 1 part by mass, relative to 100 parts by mass of the solid components of the resist underlayer film forming composition.

1.6. Solvent

The resist underlayer film forming composition of the present invention is prepared by dissolving the below-mentioned various polymers in a specific solvent, and is used in a uniform solution state.

There is no particular limitation to the solvent for the resist underlayer film forming composition of the present invention, as long as it is a solvent which can dissolve therein the polymer, and any of such solvents may be used. Particularly, the resist underlayer film forming composition of the present invention is used in a uniform solution state, and hence, taking the application properties of the composition into consideration, it is recommended that a solvent generally used in a lithography process should be also used.

Examples of such solvents include methyl cellosolve acetate, ethyl cellosolve acetate, propylene glycol, propylene glycol monomethyl ether, propylene glycol monoethyl ether, methylisobutyl carbinol, propylene glycol monobutyl ether, propylene glycol monomethyl ether acetate, propylene glycol monoethyl ether acetate, propylene glycol monopropyl ether acetate, propylene glycol monobutyl ether acetate, toluene, xylene methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethylene glycol monomethyl ether, ethylene glycol monoethyl ether, ethylene glycol monopropyl ether, ethylene glycol monobutyl ether, ethylene glycol monomethyl ether acetate, ethylene glycol monoethyl ether acetate, ethylene glycol monopropyl ether acetate, ethylene glycol monobutyl ether acetate, diethylene glycol dimethyl ether, diethylene glycol diethyl ether, diethylene glycol dipropyl ether, diethylene glycol dibutyl ether, propylene glycol monomethyl ether, propylene glycol dimethyl ether, propylene glycol diethyl ether, propylene glycol dipropyl ether, propylene glycol dibutyl ether, ethyl lactate, propyl lactate, isopropyl lactate, butyl lactate, isobutyl lactate, methyl formate, ethyl formate, propyl formate, isopropyl formate, butyl formate, isobutyl formate, amyl formate, isoamyl formate, methyl acetate, ethyl acetate, amyl acetate, isoamyl acetate, hexyl acetate, methyl propionate, ethyl propionate, propyl propionate, isopropyl propionate, butyl propionate, isobutyl propionate, methyl butyrate, ethyl butyrate, propyl butyrate, isopropyl butyrate, butyl butyrate, isobutyl butyrate, ethyl hydroxyacetate, ethyl 2-hydroxy-2-methylpropionate, methyl 3-methoxy-2-methylpropionate, methyl 2-hydroxy-3-methylbutyrate, ethyl methoxyacetate, ethyl ethoxyacetate, methyl 3-methoxypropionate, ethyl 3-ethoxypropionate, ethyl 3-methoxypropionate, 3-methoxybutyl acetate, 3-methoxypropyl acetate, 3-methyl-3-methoxybutyl acetate, 3-methyl-3-methoxybutyl propionate, 3-methyl-3-methoxybutyl butyrate, methyl acetoacetate, toluene, xylene, methyl ethyl ketone, methyl propyl ketone, methyl butyl ketone, 2-heptanone, 3-heptanone, 4-heptanone, cyclohexanone, N,N-dimethylformamide, N-methylacetamide, N,N-dimethylacetamide, N-methylpyrrolidone, 4-methyl-2-pentanol, and γ-butyrolactone. These solvents may be used alone or in combination.

Of these solvents, preferred are propylene glycol monomethyl ether, propylene glycol monomethyl ether acetate, ethyl lactate, butyl lactate, and cyclohexanone. Especially preferred are propylene glycol monomethyl ether and propylene glycol monomethyl ether acetate.

The resist underlayer film forming composition of the present invention preferably contains, as a solvent, a compound represented by the following Formula (6):

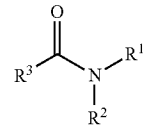

Formula (6)

wherein each of $R^1$, $R^2$, and $R^3$ represents a hydrogen atom or an alkyl group having 1 to 20 carbon atoms and being optionally interrupted by an oxygen atom, a sulfur atom, or an amide linkage, and they are the same or different, and are optionally bonded together to form a cyclic structure.

The compound represented by Formula (6) and the above-mentioned solvent may be used in combination as long as the solvent is compatible with the compound and can dissolve therein the above-mentioned polymer.

Examples of the alkyl groups having 1 to 20 carbon atoms include linear or branched alkyl groups having a substituent or having no substituent, and examples thereof include a methyl group, an ethyl group, a n-propyl group, an isopropyl group, a n-butyl group, a sec-butyl group, a tert-butyl group, a n-pentyl group, an isopentyl group, a neopentyl group, a n-hexyl group, an isohexyl group, a n-heptyl group, a n-octyl group, a cyclohexyl group, a 2-ethylhexyl group, a n-nonyl group, an isononyl group, a p-tert-butylcyclohexyl group, a n-decyl group, a n-dodecylnonyl group, an undecyl group, a dodecyl group, a tridecyl group, a tetradecyl group, a pentadecyl group, a hexadecyl group, a heptadecyl group, an octadecyl group, a nonadecyl group, and an eicosyl group. Preferred is an alkyl group having 1 to 12 carbon atoms, more preferred is an alkyl group having 1 to 8 carbon atoms, and further preferred is an alkyl group having 1 to 4 carbon atoms.

Examples of the alkyl groups having 1 to 20 carbon atoms and being optionally interrupted by an oxygen atom, a sulfur atom, or an amide linkage include alkyl groups containing a structural unit —$CH_2$—O—, —$CH_2$—S—, —$CH_2$—NHCO—, or —$CH_2$—CONH—. One unit or two or more units of —O—, —S—, —NHCO—, or —CONH— may be present in the alkyl group. Specific examples of the alkyl groups having 1 to 20 carbon atoms and being interrupted by an —O—, —S—, —NHCO—, or —CONH— unit include a methoxy group, an ethoxy group, a propoxy group, a butoxy group, a methylthio group, an ethylthio group, a propylthio group, a butylthio group, a methylcarbonylamino group, an ethylcarbonylamino group, a propylcarbonylamino group, a butylcarbonylamino group, a methylaminocarbonyl group, an ethylaminocarbonyl group, a propylaminocarbonyl group, and a butylaminocarbonyl group; as well as a methyl group, an ethyl group, a propyl group, a butyl group, a pentyl group, a hexyl group, a heptyl group, an octyl group, a nonyl group, a decyl group, a dodecyl group, and an octadecyl group, each of which is substituted with, for example, a methoxy group, an ethoxy group, a propoxy group, a butoxy group, a methylthio group, an ethylthio group, a propylthio group, a butylthio group, a methylcarbonylamino group, an ethylcarbonylamino group, a methylaminocarbonyl group, or an ethylaminocarbonyl group. Preferred are a methoxy group, an ethoxy group, a methylthio group, and an ethylthio group, and more preferred are a methoxy group and an ethoxy group.

These solvents have a relatively high boiling point, and therefore are effective in imparting high encapsulation properties or high planarization properties to the resist underlayer film forming composition.

Specific examples of the preferable compounds represented by Formula (6) include the followings.

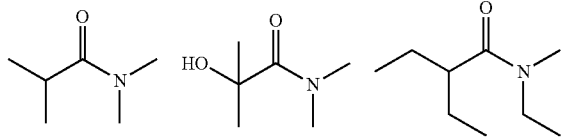
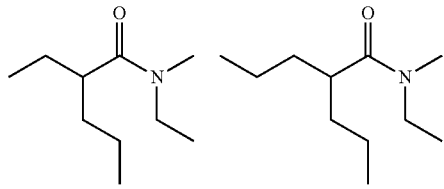
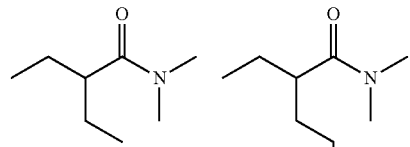
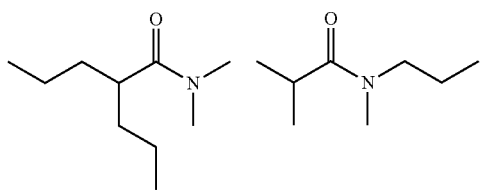
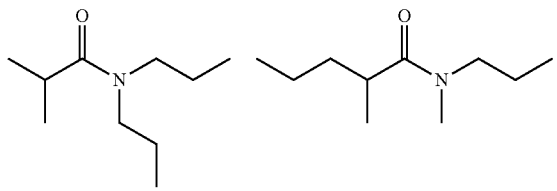
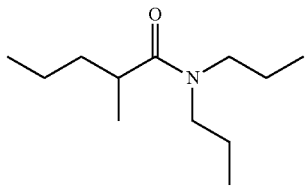
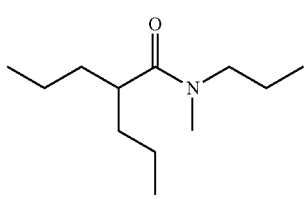
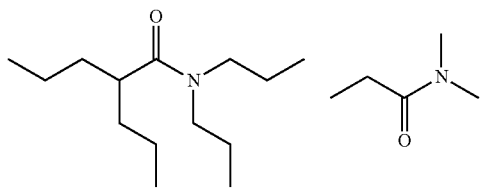
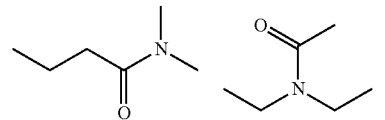

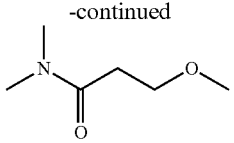

Of the above compounds, preferred are 3-methoxy-N,N-dimethylpropionamide, N,N-dimethylisobutylamide, and compounds represented by the following formulae:

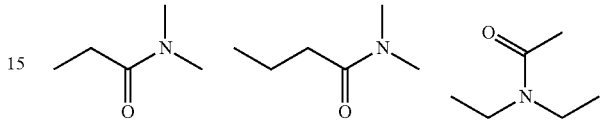

As the compound represented by Formula (6), especially preferred are 3-methoxy-N,N-dimethylpropionamide and N,N-dimethylisobutylamide.

Because the compound represented by Formula (6) above exhibits an effect even when it is contained in the resist underlayer film forming composition in a very small amount, there is no particular limitation to the amount of the compound incorporated. The compound represented by Formula (6) is preferably contained in an amount of 5% by weight or more, based on the weight of the resist underlayer film forming composition of the present invention. Also, the compound represented by Formula (6) is preferably contained in an amount of 30% by weight or less, based on the weight of the resist underlayer film forming composition of the present invention.

1.7. Surfactant

A surfactant may be incorporated into the resist underlayer film material of the present invention for further improving the application properties with respect to the surface unevenness to prevent, for example, the occurrence of pinholes or striation. Examples of the surfactants include nonionic surfactants, e.g., polyoxyethylene alkyl ethers, such as polyoxyethylene lauryl ether, polyoxyethylene stearyl ether, polyoxyethylene cetyl ether, and polyoxyethylene oleyl ether; polyoxyethylene alkylaryl ethers, such as polyoxyethylene octylphenol ether and polyoxyethylene nonylphenol ether; polyoxyethylene-polyoxypropylene block copolymers; sorbitan fatty acid esters, such as sorbitan monolaurate, sorbitan monopalmitate, sorbitan monostearate, sorbitan monooleate, sorbitan trioleate, and sorbitan tristearate; and polyoxyethylene sorbitan fatty acid esters, such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, fluorine surfactants, such as EFTOP EF301, EF303, EF352 (trade name, manufactured by Tohchem Products Co., Ltd.), MEGAFACE F171, F173, R-40, R-40N, R-40LM (trade name, manufactured by DIC Corporation), Fluorad FC430, FC431 (trade name, manufactured by Sumitomo 3M), and AsahiGuard AG710, Surflon S-382, SC101, SC102, SC103, SC104, SC105, SC106 (trade name, manufactured by Asahi Glass Co., Ltd.), and organosiloxane polymer KP341 (manufactured by Shin-Etsu Chemical Co., Ltd.). The amount of the surfactant incorporated ranges usually 2.0% by mass or less, preferably 1.0% by mass or less, based on the mass of the total solid of the resist underlayer film material. These surfactants may be used alone or in combination. When a surfactant is used, the amount of the surfactant may range 0.0001 to 5 parts by mass, or 0.001 to 1 part by mass, or 0.01 to 0.5 part by mass, relative to 100 parts by mass of the solid components of the resist underlayer film forming composition.

1.8. Other Components

In the resist underlayer film material for lithography of the present invention, for example, a light absorber, a rheology modifier, or a bonding auxiliary may be added. The rheology modifier is effective in improving the fluidity of the resist underlayer film forming composition. The bonding auxiliary is effective in improving the adhesion between the resist underlayer film and a semiconductor substrate or a resist.

As the light absorber, for example, commercially available light absorbers described in "Kougyo-you Shikiso no Gijutsu to Shijou (Techniques and Markets of Industrial Dyes)" (CMC Publishing Co., Ltd.) or "Senryo Binran (Dye Handbook)" (edited by The Society of Synthetic Organic Chemistry, Japan), for example, C. I. Disperse Yellow 1, 3, 4, 5, 7, 8, 13, 23, 31, 49, 50, 51, 54, 60, 64, 66, 68, 79, 82, 88, 90, 93, 102, 114, and 124; C. I. Disperse Orange 1, 5, 13, 25, 29, 30, 31, 44, 57, 72, and 73; C. I. Disperse Red 1, 5, 7, 13, 17, 19, 43, 50, 54, 58, 65, 72, 73, 88, 117, 137, 143, 199, and 210; C. I. Disperse Violet 43; C. I. Disperse Blue 96; C.I. Fluorescent Brightening Agent 112, 135, and 163; C. I. Solvent Orange 2 and 45; C. I. Solvent Red 1, 3, 8, 23, 24, 25, 27, and 49; C. I. Pigment Green 10; and C. I. Pigment Brown 2 may be suitably used. The light absorber is usually incorporated in an amount of 10% by mass or less, preferably 5% by mass or less, based on the mass of the total solid of the resist underlayer film material for lithography.

A rheology modifier is added mainly for the purpose of improving the fluidity of the resist underlayer film forming composition, particularly for improving the uniformity of the thickness of the resist underlayer film or for improving the filling of the inside of hole with the resist underlayer film forming composition in the baking step. Specific examples of the rheology modifiers include phthalic acid derivatives, such as dimethyl phthalate, diethyl phthalate, diisobutyl phthalate, dihexyl phthalate, and butylisodecyl phthalate; adipic acid derivatives, such as dinormalbutyl adipate, diisobutyl adipate, diisooctyl adipate, and octyldecyl adipate; maleic acid derivatives, such as dinormalbutyl maleate, diethyl maleate, and dinonyl maleate; oleic acid derivatives, such as methyl oleate, butyl oleate, and tetrahydrofurfuryl oleate; and stearic acid derivatives, such as normalbutyl stearate and glyceryl stearate. The rheology modifier is usually incorporated in an amount of less than 30% by mass, based on the mass of the total solid of the resist underlayer film material for lithography.

A bonding auxiliary is added mainly for the purpose of improving the adhesion between the resist underlayer film forming composition and a substrate or a resist to prevent the peeling off of the resist particularly in the development. Specific examples of the bonding auxiliaries include chlorosilanes, such as trimethylchlorosilane, dimethylmethylolchlorosilane, methyldiphenylchlorosilane, and chloromethyldimethylchlorosilane; alkoxysilanes, such as trimethylmethoxysilane, dimethyldiethoxysilane, methyldimethoxysilane, dimethylmethylolethoxysilane, diphenyldimethoxysilane, and phenyltriethoxysilane; silazanes, such as hexamethyldisilazane, N,N'-bis(trimethylsilyl)urea, dimethyltrimethylsilylamine, and trimethylsilylimidazole; silanes, such as methyloltrichlorosilane, γ-chloropropyltrimethoxysilane, γ-aminopropyltriethoxysilane, and γ-glycidoxypropyltrimethoxysilane; heterocyclic compounds, such as benzotriazole, benzimidazole, indazole, imidazole, 2-mercaptobenzimidazole, 2-mercaptobenzothiazole, 2-mercaptobenzoxazole, urazole, thiouracil, mercaptoimidazole, and mercaptopyrimidine; and urea or thiourea compounds, such as 1,1-dimethylurea and 1,3-dimethylurea. The bonding auxiliary is usually incorporated in an amount of less than 5% by mass, preferably less than 2% by mass, based on the mass of the total solid of the resist underlayer film material for lithography.

1.9. Resist Underlayer Film Forming Composition

The resist underlayer film forming composition of the present invention usually has a solid content of 0.1 to 70% by mass, preferably 0.1 to 60% by mass. The solid content refers to the content of components left behind the elimination of the solvent from the resist underlayer film forming composition. The proportion of the polymer in the solid components ranges, with the increasing preference, 1 to 100% by mass, 1 to 99.9% by mass, 50 to 99.9% by mass, 50 to 95% by mass, and 50 to 90% by mass.

One of the measures for checking whether or not the resist underlayer film forming composition is in a uniform solution state is to observe the capability of the composition passing through a predetermined microfilter. The resist underlayer film forming composition of the present invention is in such a uniform solution state that it can pass through a microfilter having a pore diameter of 0.1 μm.

Examples of the materials for the microfilter include fluororesins, such as PTFE (polytetrafluoroethylene) and PFA (tetrafluoroethylene-perfluoroalkyl vinyl ether copolymer), PE (polyethylene), UPE (ultra-high molecular weight polyethylene), PP (polypropylene), PSF (polysulfone), PES (polyether sulfone), and nylon. A microfilter made of PTFE (polytetrafluoroethylene) is preferred.

2. Resist Underlayer Film and Method for Producing Semiconductor Device

Hereinbelow, a resist underlayer film using the resist underlayer film forming composition of the present invention and a method for producing a semiconductor device are described.

The resist underlayer film in the present invention can be produced by applying the above-described resist underlayer film forming composition onto a semiconductor substrate and baking the applied composition.

The resist underlayer film forming composition of the present invention is applied onto a substrate used in the production of a semiconductor device (for example, a silicon wafer substrate, a silicon/silicon dioxide coated substrate, a silicon nitride substrate, a glass substrate, an ITO substrate, a polyimide substrate, or a low permittivity material (low-k material) coated substrate) by an appropriate application technique, such as with a spinner or a coater. Then, the applied composition is baked to form a resist underlayer film. The conditions for baking are appropriately selected from those at a baking temperature of 80 to 250° C. for a baking time of 0.3 to 60 minutes. Preferred conditions for baking are those at a baking temperature of 150 to 250° C. for a baking time of 0.5 to 2 minutes. The thickness of the formed resist underlayer film may range, for example, 10 to 1,000 nm, or 20 to 500 nm, or 30 to 300 nm, or 50 to 300 nm, or 50 to 200 nm.

Further, an inorganic resist underlayer film (hard mask) may be formed on the organic resist underlayer film in the present invention. For example, an inorganic resist underlayer film may be formed by a method of applying the silicon-containing resist underlayer film (inorganic resist underlayer film) forming composition described in WO 2009/104552 A1 by spin coating; or a Si inorganic material film may be formed by, for example, a CVD method.

Also, the resist underlayer film forming composition of the present invention may be applied and baked onto a semiconductor substrate having a part having a step and a part having no step (so-called stepped substrate), to form a resist underlayer film having a step between the part having a step and the part having no step within the range of from 3 to 50 nm.

Then, for example, a layer of photoresist is formed on the resist underlayer film. The layer of photoresist can be formed by a known method, namely, by applying a solution of a photoresist composition onto the resist underlayer film and baking the applied composition. The thickness of the photoresist may range, for example, 50 to 10,000 n, or 100 to 2,000 nm, or 200 to 1,000 nm.

There is no particular limitation to the photoresist formed on the resist underlayer film, as long as the photoresist is sensitive to light used in the exposure. Both a negative photoresist and a positive photoresist may be used. There are, for example, a positive photoresist comprising a novolak resin and 1,2-naphthoquinonediazidosulfonate; a chemical amplification photoresist comprising a photo-acid generator and a binder having a group decomposable by an acid to increase the alkali solubility; a chemical amplification photoresist comprising an alkali-soluble binder, a photo-acid generator, and a low-molecular weight compound decomposable by an acid to increase the alkali solubility of the photoresist; and a chemical amplification photoresist comprising a photo-acid generator, a binder having a group decomposable by an acid to increase the alkali solubility, and a low-molecular weight compound decomposable by an acid to increase the alkali solubility of the photoresist. For example, the examples thereof include trade name: APEX-E, manufactured by Shipley Company, Inc., trade name: PAR710, manufactured by Sumitomo Chemical Co., Ltd., and trade name: SEPR430, manufactured by Shin-Etsu Chemical Co., Ltd. Also, they include fluorine atom-containing polymer photoresists described in, for example, Proc. SPIE, Vol. 3999, 330-334 (2000), Proc. SPIE, Vol. 3999, 357-364 (2000), and Proc. SPIE, Vol. 3999, 365-374 (2000).

Next, exposure through a predetermined mask is conducted. In the exposure, for example, a near ultraviolet light, a far ultraviolet light, or an extreme ultraviolet light (for example, an EUV (wavelength: 13.5 nm)) is used. Specifically, for example, a KrF excimer laser (wavelength: 248 nm), an ArF excimer laser (wavelength: 193 nm), or an $F_2$ excimer laser (wavelength: 157 nm) may be used. Of these, an ArF excimer laser (wavelength: 193 nm) and an EUV (wavelength: 13.5 nm) are preferred. After the exposure, if necessary, post exposure baking may be performed. The post exposure baking is performed under conditions appropriately selected from those at a heating temperature of 70 to 150° C. for a heating time of 0.3 to 10 minutes.

Also, in the present invention, as a resist, instead of the photoresist, a resist for electron beam lithography may be used. Both of a negative electron beam resist and a positive electron beam resist may be used. There are, for example, a chemical amplification resist comprising an acid generator and a binder having a group decomposable by an acid to change the alkali solubility; a chemical amplification resist comprising an alkali-soluble binder, an acid generator, and a low-molecular weight compound decomposable by an acid to change the alkali solubility of the resist; a chemical amplification resist comprising an acid generator, a binder having a group decomposable by an acid to change the alkali solubility, and a low-molecular weight compound decomposable by an acid to change the alkali solubility of the resist; a non-chemical amplification resist comprising a binder having a group decomposable by an electron beam to change the alkali solubility; and a non-chemical amplification resist comprising a binder having a site that can be broken by an electron beam to change the alkali solubility. Also in the case of using the electron beam resist, a resist pattern may be formed in the manner similar to that in the case of using a photoresist by using an electron beam as the irradiation source.

Then, development using a developer is conducted. In the development, for example, in the case where a positive photoresist is used, the photoresist in the portion exposed to light is removed to form a pattern of the photoresist.

Examples of the developers include alkaline aqueous solutions, e.g., aqueous solutions of an alkali metal hydroxide, such as potassium hydroxide or sodium hydroxide, aqueous solutions of a quaternary ammonium hydroxide, such as tetramethylammonium hydroxide, tetraethylammonium hydroxide, or choline, and aqueous solutions of an amine, such as ethanolamine, propylamine, or ethylenediamine. Further, for example, a surfactant can be added to the above developer. The conditions for the development are appropriately selected from those at a temperature of 5 to 50° C. for a period of time of 10 to 600 seconds.

Subsequently, using the thus formed photoresist (upper layer) pattern as a protective film, the inorganic underlayer film (intermediate layer) is removed, and then, using a film comprising the patterned photoresist and inorganic underlayer film (intermediate layer) as a protective film, the organic underlayer film (lower layer) is removed. Finally, using the patterned inorganic underlayer film (intermediate layer) and organic underlayer film (lower layer) as a protective film, processing of the semiconductor substrate is performed.

First, a portion of the inorganic underlayer film (intermediate layer), from which the photoresist has been removed, is removed by dry etching so that the semiconductor substrate is exposed. For dry etching of the inorganic underlayer film, for example, a gas of tetrafluoromethane ($CF_4$), perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride, chlorine trifluoride, chlorine, trichloroborane, or dichloroborane may be used. For dry etching of the inorganic underlayer film, a halogen-based gas is preferably used, and a fluorine-based gas is more preferably used. Examples of the fluorine-based gases include tetrafluoromethane ($CF_4$), perfluorocyclobutane ($C_4F_8$), perfluoropropane ($C_3F_8$), trifluoromethane, and difluoromethane ($CH_2F_2$).

Then, using a film comprising the patterned photoresist and inorganic underlayer film as a protective film, the organic underlayer film is removed. The organic underlayer film (lower layer) is preferably removed by dry etching using an oxygen-based gas. The reason for this is that the inorganic underlayer film containing silicon atoms in a large amount is unlikely to be removed by dry etching using an oxygen-based gas.

Finally, processing of the semiconductor substrate is conducted. The processing of the semiconductor substrate is preferably conducted by dry etching using a fluorine-based gas.

Examples of the fluorine-based gas includes tetrafluoromethane ($CF_4$), perfluorocyclobutane ($C_4F_8$), perfluoropropane ($C_3F_8$), trifluoromethane, and difluoromethane ($CH_2F_2$).

Also, as an upper layer of the resist underlayer film, an organic anti-reflective film may be formed before the formation of the photoresist. The anti-reflective film composition used for this is not particularly limited and may be optionally selected from compositions commonly used in a conventional lithography process, and the formation of the anti-reflective film may be performed by a commonly used method, for example, by coating by a spinner or a coater and by baking.

In the present invention, after an organic underlayer film is formed on a substrate, an inorganic underlayer film may be formed thereon, and a photoresist may be coated thereon. Thus, even when the pattern width of the photoresist becomes smaller and the photoresist is coated thinly for preventing a pattern collapse, the processing of the substrate is possible by selecting an appropriate etching gas. For example, the resist underlayer film may be processed with a fluorine-based gas having an etching rate of the resist underlayer film satisfactorily higher than that of the photoresist as an etching gas. The substrate may be processed with a fluorine-based gas having an etching rate of the substrate satisfactorily higher than that of the inorganic underlayer film as an etching gas. Furthermore, the substrate may be processed with an oxygen-based gas having an etching rate of the substrate satisfactorily higher than that of the organic underlayer film as an etching gas.

Furthermore, depending on the wavelength of light used in the lithography process, the resist underlayer film formed from the resist underlayer film-forming composition may absorb the light. In such a case, the resist underlayer film may function as an anti-reflective film having an effect of preventing the reflected light from the substrate. Furthermore, the underlayer film formed from the resist underlayer film-forming composition according to the present invention may function as a hardmask. The underlayer film according to the present invention may be used as a layer to prevent interaction between a substrate and a photoresist, a layer having a function of preventing negative effects to the substrate by the materials used in a photoresist or by the substances generated at the time of exposure of the photoresist, a layer having a function to prevent diffusion of the substances generated from the substrate at the time of baking into an upper layer photoresist, a barrier layer for reducing a poisoning effect to the photoresist layer by a semiconductor substrate dielectric layer, and the like.

An underlayer film formed from the resist underlayer film-forming composition may be applied to a substrate, in which a via hole used in the dual damascene process is formed, and may be used as an embedding material capable of filling the hole without any void. Furthermore, the underlayer film may also be used as a planarizing material for planarizing the surface of a semiconductor substrate having a recess and a protrusion.

EXAMPLES

Hereinbelow, the present invention will be described in more detail with reference to the following Examples and others, but the embodiments shown below should not be construed as limiting the scope of the present invention.

Synthesis Examples and Comparative Synthesis Examples are shown below. BINFL and DM-BINFL are abbreviations for the following compounds.

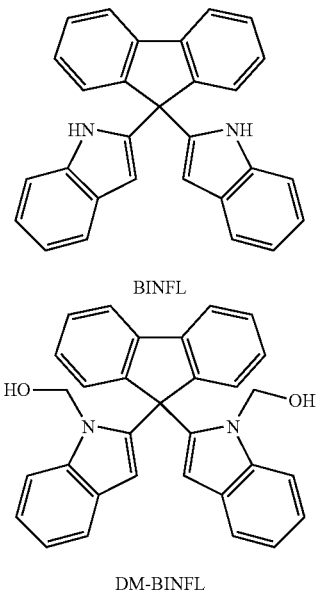

BINFL

DM-BINFL

Synthesis Example 1

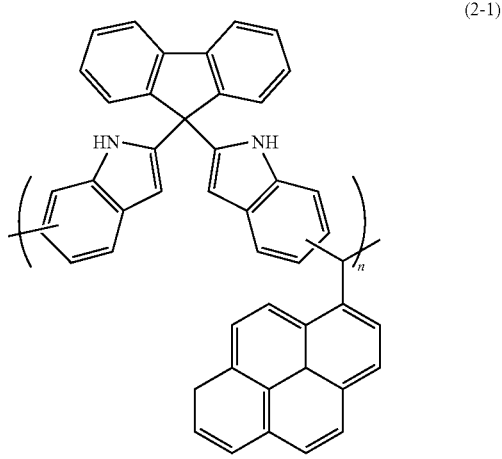

(2-1)

In a 100 mL two-neck flask were charged 3.17 g of BINFL (manufactured by Asahi Yukizai Corporation), 3.00 g of 1-pyrenecarboxyaldehyde (manufactured by Sigma-Aldrich Co. LLC), 15.03 g of N-methyl-2-pyrrolidinone (manufactured by Kanto Chemical Co., Inc.), 15.03 g of propylene glycol monomethyl ether acetate, and 0.25 g of methanesulfonic acid (manufactured by Tokyo Chemical Industry Co., Ltd.). Then, the resultant mixture was heated to 150° C., and stirred under reflux for about 15 hours. After completion of the reaction, the resultant reaction mixture was diluted with 25.24 g of cyclohexanone. The diluted solution was dropwise added to a methanol solution to reprecipitate. The obtained precipitate was subjected to suction filtration, and the residue was subjected to vacuum drying at 60° C. overnight, to obtain 4.85 g of a powder resin. The obtained polymer corresponded to Formula (2-1). The polymer had a weight average molecular weight Mw of 1,870, as measured by GPC using a conversion calibration curve obtained from the standard polystyrene.

Synthesis Example 2

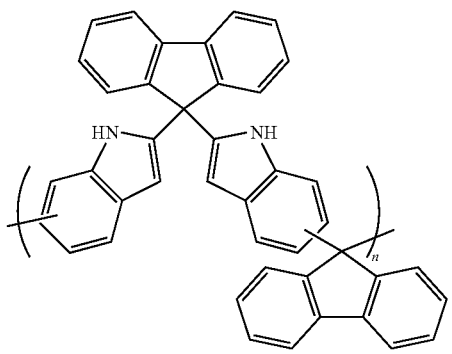

(2-2)

In a 100 mL two-neck flask were charged 5.45 g of BINFL (manufactured by Asahi Yukizai Corporation), 4.00 g of 9-fluorenone (manufactured by Tokyo Chemical Industry Co., Ltd.), 9.76 g of N-methyl-2-pyrrolidinone (manufactured by Kanto Chemical Co., Inc.), 9.76 g of propylene glycol monomethyl ether acetate, and 1.07 g of methanesulfonic acid (manufactured by Tokyo Chemical Industry Co., Ltd.). Then, the resultant mixture was heated to 150° C., and stirred under reflux for about 19 hours. After completion of the reaction, the resultant reaction mixture was diluted with 17.19 g of cyclohexanone. The diluted solution was dropwise added to a methanol solution to reprecipitate. The obtained precipitate was subjected to suction filtration, and the residue was subjected to vacuum drying at 60° C. overnight, to obtain 8.35 g of a powder resin. The obtained polymer corresponded to Formula (2-2). The polymer had a weight average molecular weight Mw of 4,850, as measured by GPC using a conversion calibration curve obtained from the standard polystyrene.

Synthesis Example 3

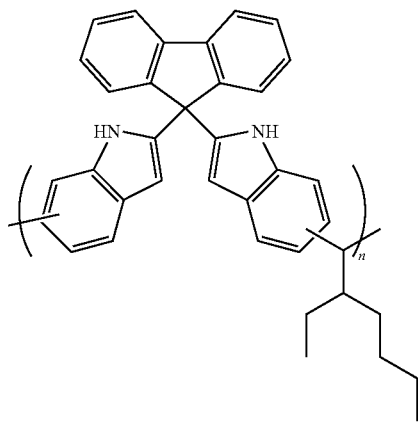

(2-3)

In a 100 mL two-neck flask were charged 7.65 g of BINFL (manufactured by Asahi Yukizai Corporation), 4.00 g of 2-ethylhexanal (manufactured by Tokyo Chemical Industry Co., Ltd.), 9.86 g of N-methyl-2-pyrrolidinone (manufactured by Kanto Chemical Co., Inc.), 9.86 g of propylene glycol monomethyl ether acetate, and 1.50 g of methanesulfonic acid (manufactured by Tokyo Chemical Industry Co., Ltd.). Then, the resultant mixture was heated to 150° C., and stirred under reflux for about 19 hours. After completion of the reaction, the resultant reaction mixture was diluted with 5.96 g of cyclohexanone. The diluted solution was dropwise added to a methanol solution to reprecipitate. The supernatant of the obtained precipitate was removed by decantation, and then the remaining material was subjected to vacuum drying at 60° C. overnight, to obtain 10.75 g of a powder resin. The obtained polymer corresponded to Formula (2-3). The polymer had a weight average molecular weight Mw of 1,130, as measured by GPC using a conversion calibration curve obtained from the standard polystyrene.

Synthesis Example 4

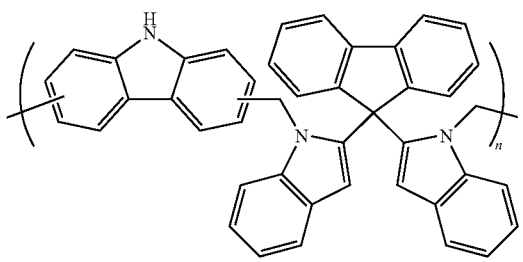

(3-1)

In a 100 mL two-neck flask were charged 3.56 g of DM-BINFL (manufactured by Asahi Yukizai Corporation), 1.50 g of carbazole (manufactured by Tokyo Chemical Industry Co., Ltd.), 4.18 g of N-methyl-2-pyrrolidinone (manufactured by Kanto Chemical Co., Inc.), 4.18 g of propylene glycol monomethyl ether acetate, and 0.51 g of methanesulfonic acid (manufactured by Tokyo Chemical Industry Co., Ltd.). Then, the resultant mixture was heated to 150° C., and stirred under reflux for about 15 hours. After completion of the reaction, the resultant reaction mixture was diluted with 11.32 g of cyclohexanone. The diluted solution was dropwise added to a methanol solution to reprecipitate. The obtained precipitate was subjected to suction filtration, and the residue was subjected to vacuum drying at 60° C. overnight, to obtain 2.36 g of a powder resin. The obtained polymer corresponded to Formula (3-1). The polymer had a weight average molecular weight Mw of 1,840, as measured by GPC using a conversion calibration curve obtained from the standard polystyrene.

Synthesis Example 5

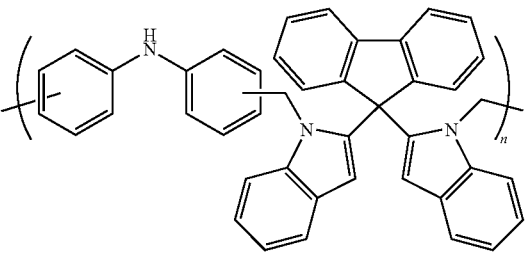

(3-2)

In a 100 mL two-neck flask were charged 4.69 g of DM-BINFL (manufactured by Asahi Yukizai Corporation), 4.69 g of diphenylamine (manufactured by Tokyo Chemical Industry Co., Ltd.), 5.52 g of N-methyl-2-pyrrolidinone (manufactured by Kanto Chemical Co., Inc.), 5.52 g of propylene glycol monomethyl ether acetate, and 0.67 g of methanesulfonic acid (manufactured by Tokyo Chemical Industry Co., Ltd.). Then, the resultant mixture was heated to 150° C., and stirred under reflux for about 19 hours. After completion of the reaction, the resultant reaction mixture was diluted with 15.03 g of cyclohexanone. The diluted solution was dropwise added to a methanol solution to reprecipitate. The obtained precipitate was subjected to suction filtration, and the residue was subjected to vacuum drying at 60° C. overnight, to obtain 3.38 g of a powder resin. The obtained polymer corresponded to Formula (3-2). The polymer had a weight average molecular weight Mw of 2,860, as measured by GPC using a conversion calibration curve obtained from the standard polystyrene.

Synthesis Example 6

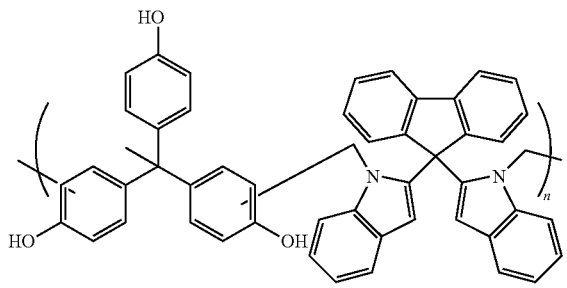

(3-3)

In a 100 mL two-neck flask were charged 5.18 g of DM-BINFL (manufactured by Asahi Yukizai Corporation), 4.00 g of 1,1,1-tris(4-hydroxyphenyl)ethane (manufactured by Tokyo Chemical Industry Co., Ltd.), 7.53 g of N-methyl-2-pyrrolidinone (manufactured by Kanto Chemical Co., Inc.), 7.53 g of propylene glycol monomethyl ether acetate, and 0.87 g of methanesulfonic acid (manufactured by Tokyo Chemical Industry Co., Ltd.). Then, the resultant mixture was heated to 150° C., and stirred under reflux for about 19 hours. After completion of the reaction, the resultant reaction mixture was diluted with 5.47 g of cyclohexanone. The diluted solution was dropwise added to a methanol solution to reprecipitate. The obtained precipitate was subjected to suction filtration, and the residue was subjected to vacuum drying at 60° C. overnight, to obtain 5.18 g of a powder resin. The obtained polymer corresponded to Formula (3-3). The polymer had a weight average molecular weight Mw of 1,270, as measured by GPC using a conversion calibration curve obtained from the standard polystyrene.

Comparative Synthesis Example 1

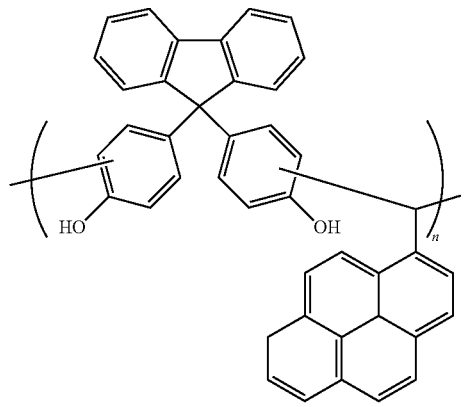

(1-1)

In a 100 mL two-neck flask were charged 8.00 g of 9,9-bis(4-hydroxy)fluorene (manufactured by Tokyo Chemical Industry Co., Ltd.), 5.30 g of 1-pyrenecarboxyaldehyde (manufactured by Sigma-Aldrich Co. LLC), 20.77 g of propylene glycol monomethyl ether acetate, and 0.55 g of methanesulfonic acid (manufactured by Tokyo Chemical Industry Co., Ltd.). Then, the resultant mixture was heated to 150° C., and stirred under reflux for about 16.5 hours. After completion of the reaction, the resultant reaction mixture was diluted with 34.62 g of cyclohexanone. The diluted solution was dropwise added to a methanol solution to reprecipitate. The obtained precipitate was subjected to suction filtration, and the residue was subjected to vacuum drying at 60° C. overnight, to obtain 7.05 g of a powder resin. The obtained polymer corresponded to Formula (1-1). The polymer had a weight average molecular weight Mw of 2,260, as measured by GPC using a conversion calibration curve obtained from the standard polystyrene.

Comparative Synthesis Example 2

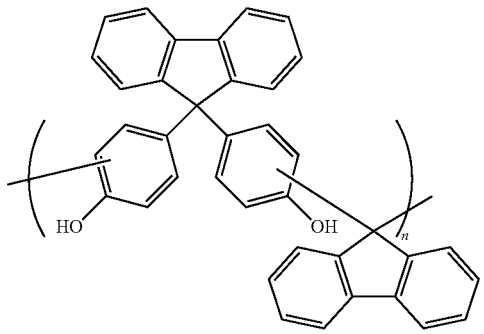

(1-2)

In a 100 mL two-neck flask were charged 8.00 g of 9,9-bis(4-hydroxy)fluorene (manufactured by Tokyo Chemical Industry Co., Ltd.), 4.11 g of 9-fluorenone (manufactured by Tokyo Chemical Industry Co., Ltd.), 19.49 g of propylene glycol monomethyl ether acetate, and 0.88 g of methanesulfonic acid (manufactured by Tokyo Chemical Industry Co., Ltd.). Then, the resultant mixture was heated to 150° C., and stirred under reflux for about 16.5 hours.

After completion of the reaction, the resultant reaction mixture was diluted with 28.09 g of cyclohexanone. The diluted solution was dropwise added to a methanol/water (80% by mass/20% by mass) solution to reprecipitate. The obtained precipitate was subjected to suction filtration, and the residue was subjected to vacuum drying at 60° C. overnight, to obtain 6.49 g of a powder resin. The obtained polymer corresponded to Formula (1-2). The polymer had a weight average molecular weight Mw of 4,600, as measured by GPC using a conversion calibration curve obtained from the standard polystyrene.

Comparative Synthesis Example 3

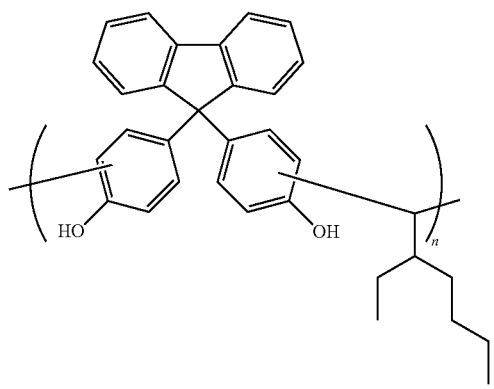

(1-3)

In a 100 mL two-neck flask were charged 10.00 g of 9,9-bis(4-hydroxy)fluorene (manufactured by Tokyo Chemical Industry Co., Ltd.), 3.66 g of 2-ethylhexanal (manufactured by Tokyo Chemical Industry Co., Ltd.), 22.13 g of propylene glycol monomethyl ether acetate, and 1.10 g of methanesulfonic acid (manufactured by Tokyo Chemical Industry Co., Ltd.). Then, the resultant mixture was heated to 150° C., and stirred under reflux for about 16.5 hours. After completion of the reaction, the resultant reaction mixture was diluted with 8.64 g of propylene glycol monomethyl ether acetate. The diluted solution was dropwise added to a methanol/water (50% by mass/50% by mass) solution to reprecipitate. The supernatant of the obtained precipitate was removed by decantation, and then the remaining material was subjected to vacuum drying at 60° C. overnight, to obtain 14.21 g of a powder resin. The obtained polymer corresponded to Formula (1-3). The polymer had a weight average molecular weight Mw of 1,420, as measured by GPC using a conversion calibration curve obtained from the standard polystyrene.

Example 1

The resin obtained in Synthesis Example 1 was dissolved in cyclohexanone, and then subjected to ion exchange to obtain a resin solution (solid content: 18.45% by mass). To 5.50 g of the resin solution were added 0.20 g of a propylene glycol monomethyl ether acetate solution containing 1% of a surfactant (MEGAFACE R-40, manufactured by DIC Corporation), 0.714 g of propylene glycol monomethyl ether acetate, and 3.75 g of cyclohexanone. The resultant mixture was subjected to filtration using a polytetrafluoroethylene microfilter having a pore diameter of 0.1 μm to prepare a solution of a resist underlayer film forming composition.

Example 2

The resin obtained in Synthesis Example 2 was dissolved in cyclohexanone, and then subjected to ion exchange to obtain a resin solution (solid content: 18.85% by mass). To 5.00 g of the resin solution were added 0.19 g of a propylene glycol monomethyl ether acetate solution containing 1% of a surfactant (MEGAFACE R-40, manufactured by DIC Corporation), 0.895 g of propylene glycol monomethyl ether acetate, and 5.66 g of cyclohexanone. The resultant mixture was subjected to filtration using a polytetrafluoroethylene microfilter having a pore diameter of 0.1 μm to prepare a solution of a resist underlayer film forming composition.

Example 3

The resin obtained in Synthesis Example 3 was dissolved in propylene glycol monomethyl ether acetate, and then subjected to ion exchange to obtain a resin solution (solid content: 16.50% by mass). To 6.50 g of the resin solution were added 0.11 g of a propylene glycol monomethyl ether acetate solution containing 1% of a surfactant (MEGAFACE R-40, manufactured by DIC Corporation), 1.23 g of propylene glycol monomethyl ether acetate, and 2.90 g of propylene glycol monomethyl ether. The resultant mixture was subjected to filtration using a polytetrafluoroethylene microfilter having a pore diameter of 0.1 μm to prepare a solution of a resist underlayer film forming composition.

Example 4

The resin obtained in Synthesis Example 4 was dissolved in cyclohexanone, and then subjected to ion exchange to obtain a resin solution (solid content: 16.45% by mass). To 6.00 g of the resin solution were added 0.20 g of a propylene glycol monomethyl ether acetate solution containing 1% of a surfactant (MEGAFACE R-40, manufactured by DIC Corporation), 0.695 g of propylene glycol monomethyl ether acetate, and 3.00 g of cyclohexanone. The resultant mixture was subjected to filtration using a polytetrafluoroethylene microfilter having a pore diameter of 0.1 μm to prepare a solution of a resist underlayer film forming composition.

Example 5

The resin obtained in Synthesis Example 5 was dissolved in cyclohexanone, and then subjected to ion exchange to obtain a resin solution (solid content: 19.70% by mass). To 4.80 g of the resin solution were added 0.19 g of a propylene glycol monomethyl ether acetate solution containing 1% of a surfactant (MEGAFACE R-40, manufactured by DIC Corporation), 0.901 g of propylene glycol monomethyl ether acetate, and 5.90 g of cyclohexanone. The resultant mixture was subjected to filtration using a polytetrafluoroethylene microfilter having a pore diameter of 0.1 μm to prepare a solution of a resist underlayer film forming composition.

Example 6

The resin obtained in Synthesis Example 6 was dissolved in propylene glycol monomethyl ether, and then subjected to ion exchange to obtain a resin solution (solid content: 17.40% by mass). To 5.00 g of the resin solution were added 0.09 g of a propylene glycol monomethyl ether acetate solution containing 1% of a surfactant (MEGAFACE R-40, manufactured by DIC Corporation), 2.91 g of propylene glycol monomethyl ether acetate, and 2.88 g of propylene glycol monomethyl ether. The resultant mixture was subjected to filtration using a polytetrafluoroethylene microfilter having a pore diameter of 0.1 µm to prepare a solution of a resist underlayer film forming composition.

Example 7

BINFL (manufactured by Asahi Yukizai Corporation) was dissolved in cyclohexanone to obtain a cyclohexanone solution containing BINFL (solid content: 21.74% by mass). To 1.45 g of the solution were added 0.06 g of a propylene glycol monomethyl ether acetate solution containing 1% of a surfactant (MEGAFACE R-40, manufactured by DIC Corporation), 0.09 g of TMOM-BP (manufactured by Honshu Chemical Industry Co., Ltd.), 0.47 g of a propylene glycol monomethyl ether solution containing 2% of K-PURE TAG2689 (trifluoromethanesulfonic acid compound, manufactured by King Industries, Inc.), 3.89 g of cyclohexanone, and 0.03 g of propylene glycol monomethyl ether. The resultant mixture was thoroughly stirred, and then subjected to filtration using a polytetrafluoroethylene microfilter having a pore diameter of 0.1 µm to prepare a solution of a resist underlayer film forming composition.

Example 8

DM-BINFL (manufactured by Asahi Yukizai Corporation) was dissolved in cyclohexanone to obtain a cyclohexanone solution containing DM-BINFL (solid content: 18.63% by mass). To 1.69 g of the solution were added 0.06 g of a propylene glycol monomethyl ether acetate solution containing 1% of a surfactant (MEGAFACE R-40, manufactured by DIC Corporation), 0.09 g of TMOM-BP (manufactured by Honshu Chemical Industry Co., Ltd.), 0.47 g of a propylene glycol monomethyl ether solution containing 2% of K-PURE TAG2689 (trifluoromethanesulfonic acid compound, manufactured by King Industries, Inc.), 3.64 g of cyclohexanone, and 0.03 g of propylene glycol monomethyl ether. The resultant mixture was thoroughly stirred, and then subjected to filtration using a polytetrafluoroethylene microfilter having a pore diameter of 0.1 µm to prepare a solution of a resist underlayer film forming composition.

Example 9

The resin obtained in Synthesis Example 1 was dissolved in cyclohexanone, and then subjected to ion exchange to obtain a resin solution (solid content: 18.45% by mass). To 3.00 g of the resin solution were added 0.07 g of a propylene glycol monomethyl ether acetate solution containing 1% of a surfactant (MEGAFACE R-40, manufactured by DIC Corporation), 0.21 g of TMOM-BP (manufactured by Honshu Chemical Industry Co., Ltd.), 1.06 g of a propylene glycol monomethyl ether solution containing 2% of K-PURE TAG2689 (trifluoromethanesulfonic acid compound, manufactured by King Industries, Inc.), 6.91 g of cyclohexanone, and 0.51 g of propylene glycol monomethyl ether. The resultant mixture was thoroughly stirred, and then subjected to filtration using a polytetrafluoroethylene microfilter having a pore diameter of 0.1 µm to prepare a solution of a resist underlayer film forming composition.

Comparative Example 1

The resin obtained in Comparative Synthesis Example 1 was dissolved in cyclohexanone, and then subjected to ion exchange to obtain a resin solution (solid content: 22.65% by mass). To 5.50 g of the resin solution were added 0.11 g of a propylene glycol monomethyl ether acetate solution containing 1% of a surfactant (MEGAFACE R-40, manufactured by DIC Corporation)acetate, 1.19 g of propylene glycol monomethyl ether acetate, and 7.87 g of cyclohexanone. The resultant mixture was subjected to filtration using a polytetrafluoroethylene microfilter having a pore diameter of 0.1 µm to prepare a solution of a resist underlayer film forming composition.

Comparative Example 2

The resin obtained in Comparative Synthesis Example 2 was dissolved in propylene glycol monomethyl ether acetate, and then subjected to ion exchange to obtain a resin solution (solid content: 21.95% by mass). To 6.50 g of the resin solution were added 0.14 g of a propylene glycol monomethyl ether acetate solution containing 1% of a surfactant (MEGAFACE R-40, manufactured by DIC Corporation), 3.78 g of propylene glycol monomethyl ether acetate, and 3.86 g of propylene glycol monomethyl ether. The resultant mixture was subjected to filtration using a polytetrafluoroethylene microfilter having a pore diameter of 0.1 µm to prepare a solution of a resist underlayer film forming composition.

Comparative Example 3

The resin obtained in Comparative Synthesis Example 3 was dissolved in propylene glycol monomethyl ether acetate, and then subjected to ion exchange to obtain a resin solution (solid content: 20.67% by mass). To 7.00 g of the resin solution were added 0.14 g of a propylene glycol monomethyl ether acetate solution containing 1% of a surfactant (MEGAFACE R-40, manufactured by DIC Corporation), 3.43 g of propylene glycol monomethyl ether acetate, and 3.91 g of propylene glycol monomethyl ether. The resultant mixture was subjected to filtration using a polytetrafluoroethylene microfilter having a pore diameter of 0.1 µm to prepare a solution of a resist underlayer film forming composition.

(Test for Dissolution into Resist Solvent)

Each of the solutions of the resist underlayer film forming composition prepared in Comparative Examples 1 to 3 and Examples 1 to 9 was applied onto a silicon wafer using a spin coater, and baked on a hotplate at 400° C. for 90 seconds to form a resist underlayer film (thickness: 0.20 µm). In Comparative Example 3, from the viewpoint of the heat resistance, it was difficult to maintain the thickness of the film, and therefore the applied composition was baked at 350° C. for 90 seconds to form a resist underlayer film (thickness: 0.20 µm). In Examples 7 to 9, the applied composition was baked at 240° C. for 90 seconds to form a resist underlayer film (thickness: 0.20 µm). Each of the formed resist underlayer films was immersed in each of ethyl lactate, propylene glycol monomethyl ether, propylene glycol monomethyl ether acetate, and cyclohexanone, which are solvents used in the resist. The resist underlayer films were insoluble in these solvents.

(Measurement of Optical Coefficient)

Each of the solutions of the resist underlayer film forming composition prepared in Comparative Examples 1 to 3 and Examples 1 to 9 was applied onto a silicon wafer using a spin coater. The applied composition was baked on a hotplate at 400° C. for 90 seconds to form a resist underlayer film (thickness: 0.05 µm). In Comparative Example 3, from the viewpoint of the heat resistance, it was difficult to maintain the thickness of the film, and therefore the applied composition was baked at 350° C. for 90 seconds to form a resist underlayer film (thickness: 0.20 µm). In Examples 7 to 9, the applied composition was baked at 240° C. for 90 seconds to form a resist underlayer film (thickness: 0.20 µm). For each of the formed resist underlayer films, using a spectroscopic ellipsometer, a refractive index (n value) and an optical absorption coefficient (also called a k value or an attenuation coefficient) at a wavelength of 193 nm or 248 nm were measured. The results are shown in Table 1.

TABLE 1

Refractive index n and optical absorption coefficient k

|  |  | n/k 193 nm | n/k 248 nm |
|---|---|---|---|
| Example 1 | 400° C. Baked film | 1.47/0.62 | 1.75/0.63 |
| Example 2 | 400° C. Baked film | 1.39/0.56 | 1.78/0.49 |
| Example 3 | 400° C. Baked film | 1.43/0.48 | 1.68/0.49 |
| Example 4 | 400° C. Baked film | 1.45/0.47 | 1.67/0.53 |
| Example 5 | 400° C. Baked film | 1.44/0.54 | 1.66/0.47 |
| Example 6 | 400° C. Baked film | 1.44/0.52 | 1.69/0.47 |
| Example 7 | 240° C. Baked film | 1.41/0.56 | 1.89/0.36 |
| Example 8 | 240° C. Baked film | 1.42/0.52 | 1.91/0.35 |
| Example 9 | 240° C. Baked film | 1.48/0.64 | 1.81/0.60 |
| Comparative Example 1 | 400° C. Baked film | 1.45/0.62 | 1.78/0.54 |
| Comparative Example 2 | 400° C. Baked film | 1.42/0.56 | 1.82/0.43 |
| Comparative Example 3 | 350° C. Baked film | 1.42/0.54 | 1.85/0.37 |

(Measurement of Dry Etching Rate)

The etcher and etching gas used in the measurement of a dry etching rate are as follows.

RIE-10NR (manufactured by Samco Inc.): $CF_4$

Each of the solutions of the resist underlayer film forming composition prepared in Comparative Examples 1 to 3 and Examples 1 to 9 was applied onto a silicon wafer using a spin coater. The applied composition was baked on a hotplate at 400° C. for 90 seconds to form a resist underlayer film (thickness: 0.20 µm). In Comparative Example 3, from the viewpoint of the heat resistance, it was difficult to maintain the thickness of the film, and therefore the applied composition was baked at 350° C. for 90 seconds to forma resist underlayer film (thickness: 0.20 µm). In Examples 7 to 9, the applied composition was baked at 240° C. for 90 seconds to form a resist underlayer film (thickness: 0.20 µm). A dry etching rate was measured using $CF_4$ gas as an etching gas. Comparative Examples 1 to 3 and Examples 1 to 9 were compared in dry etching rate for the resist underlayer film. The results are shown in Table 3. The dry etching rate ratio is a (resist underlayer film)/(KrF photoresist) dry etching rate ratio.

TABLE 2

Dry etching rate ratio

| Example 1 | Rate ratio for 400° C. Baked film | 0.70 |
|---|---|---|
| Example 2 | Rate ratio for 400° C. Baked film | 0.78 |
| Example 3 | Rate ratio for 400° C. Baked film | 0.83 |
| Example 4 | Rate ratio for 400° C. Baked film | 0.86 |
| Example 5 | Rate ratio for 400° C. Baked film | 0.82 |
| Example 6 | Rate ratio for 400° C. Baked film | 0.88 |
| Example 7 | Rate ratio for 240° C. Baked film | 0.78 |
| Example 8 | Rate ratio for 240° C. Baked film | 0.79 |
| Example 9 | Rate ratio for 240° C. Baked film | 0.73 |
| Comparative Example 1 | Rate ratio for 400° C. Baked film | 0.78 |

TABLE 2-continued

Dry etching rate ratio

| Comparative Example 2 | Rate ratio for 400° C. Baked film | 0.90 |
|---|---|---|
| Comparative Example 3 | Rate ratio for 350° C. Baked film | 0.87 |

(Heat Resistance Test for Resist Underlayer Film)

Each of the solutions of the resist underlayer film forming composition prepared in Comparative Examples 1 to 3 and Examples 1 to 6 was applied onto a silicon wafer using a spin coater, and baked on a hotplate at 400° C. for one minute and 30 seconds or at 350° C. for one minute and 30 seconds to form a resist underlayer film (thickness: 0.20 µm). The obtained film was subjected to thermogravimetric analysis in the air in which the film was heated at a temperature elevation rate of 10° C. per minute from room temperature (about 20° C.), and the change of weight loss with the passage of time was monitored. The results are shown in Table 3.

TABLE 3

Temperature for 5% weight loss of resist underlayer film 500° C. Weight loss temperature (° C.)

| Example 1 | 400° C. Baked film | 462 |
|---|---|---|
| Example 2 | 400° C. Baked film | 407 |
| Example 4 | 400° C. Baked film | 386 |
| Example 5 | 400° C. Baked film | 398 |
| Example 6 | 400° C. Baked film | 368 |
| Comparative Example 1 | 400° C. Baked film | 425 |
| Comparative Example 2 | 400° C. Baked film | 384 |

INDUSTRIAL APPLICABILITY

By the present invention, there is provided a resist underlayer film forming composition which is advantageous not only in that the composition has excellent application properties, but also in that the composition provides a resist underlayer film having, for example, high etching resistance and high heat resistance.

The invention claimed is:

1. A resist underlayer film forming composition, comprising a compound represented by the following Formula (1):

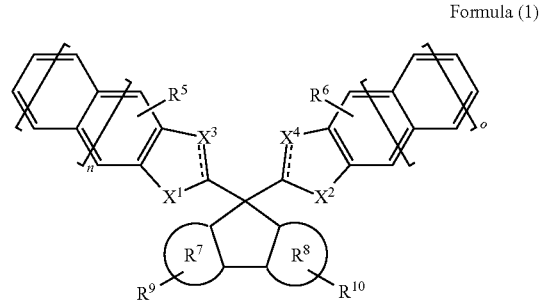

Formula (1)

wherein:
 represents a single bond or a double bond;
$X^1$ represents —N($R^1$)— or —CH($R^1$)—;
$X^2$ represents —N($R^2$)— or —CH($R^2$)—;
$X^3$ represents —N=, —CH=, —N($R^3$)—, or —CH($R^3$)—;
$X^4$ represents —N=, —CH=, —N($R^4$)—, or —CH($R^4$)—;

wherein at least one of $X^1$, $X^2$, $X^3$, and $X^4$ contains a nitrogen atom;

wherein $R^1$, $R^2$, $R^3$, and $R^4$ are the same or different, and each represents a hydrogen atom, a C1-20 linear, branched, or cyclic alkyl group, a C6-20 aryl group, a C2-10 alkenyl group, a C2-10 alkynyl group, a carboxy group, or a cyano group, wherein each of the alkyl group and aryl group is optionally substituted with a C1-6 acyl group, a C1-6 alkoxy group, a C1-6 alkoxycarbonyl group, an amino group, a glycidyl group, or a hydroxy group, and is optionally interrupted by an oxygen atom or a sulfur atom;

$R^5$, $R^6$, $R^9$, and $R^{10}$ are the same or different, and each represents a hydrogen atom, a hydroxy group, a C1-6 acyl group, a C1-6 alkoxy group, a C1-6 alkoxycarbonyl group, a C1-10 linear, branched, or cyclic alkyl group, a C6-20 aryl group, a C2-20 alkenyl group, or a C2-10 alkynyl group, wherein each of the acyl group, alkoxy group, alkoxycarbonyl group, alkyl group, aryl group, alkenyl group, and alkynyl group optionally has one or two or more groups selected from the group consisting of an amino group, a nitro group, a cyano group, a hydroxy group, a glycidyl group, and a carboxy group;

$R^7$ and $R^8$ are the same or different, and each represents a benzene ring or a naphthalene ring; and n and o are 0 or 1.

2. The resist underlayer film forming composition according to claim 1, wherein $R^1$, $R^2$, $R^3$, or $R^4$ in Formula (1) is a hydroxy group or a C1-20 linear, branched, or cyclic alkyl group which is optionally substituted with a hydroxy group, and which is optionally interrupted by an oxygen atom or a sulfur atom.

3. A resist underlayer film forming composition, comprising a compound containing at least one unit of one or two or more repeating units a, b, c, d, e, f, g, h, and i represented by the following Formula (2):

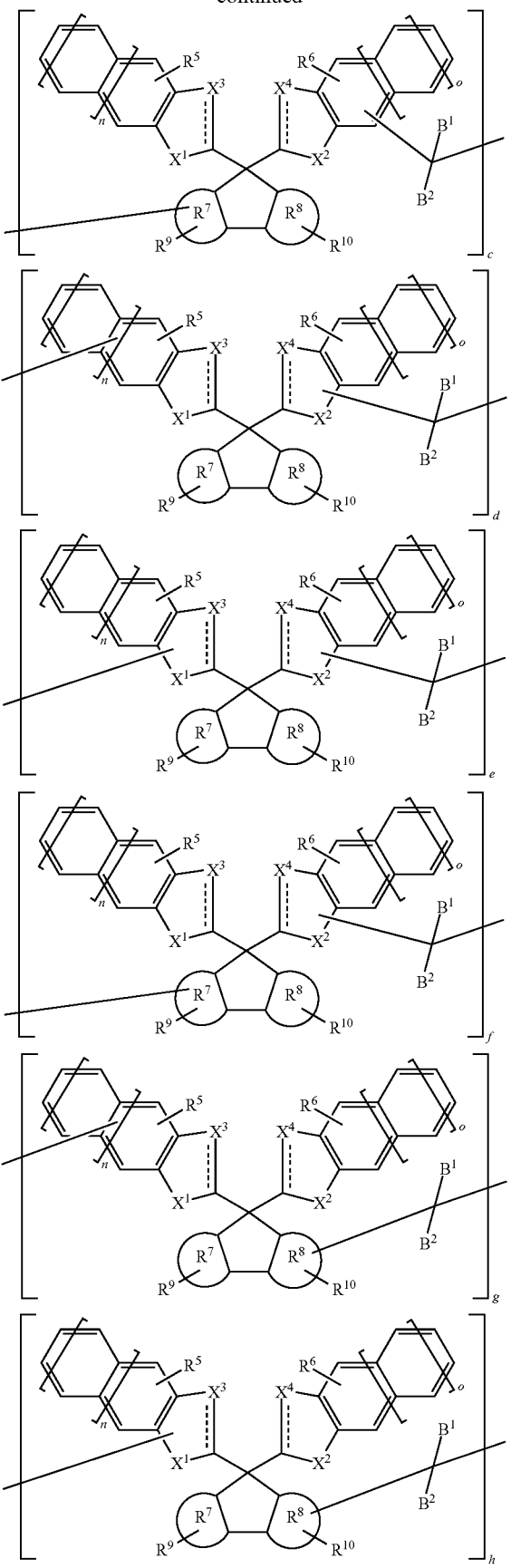

-continued

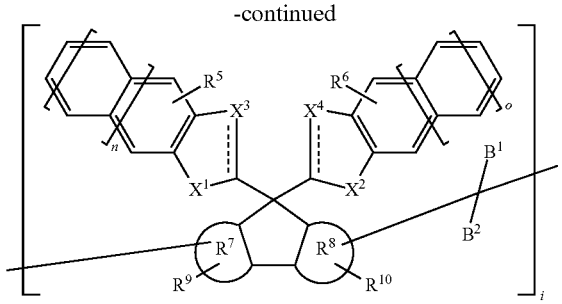

Formula (2)
wherein:
~~~~~ represents a single bond or a double bond;
$X^1$ represents —N($R^1$)—, —CH($R^1$)—, —N<, or —CH<;
$X^2$ represents —N($R^2$)—, —CH($R^2$)—, —N<, or —CH<;
$X^3$ represents —N=, —CH=, —N($R^3$)—, —CH($R^3$)—, —N<, or —CH<;
$X^4$ represents —N=, —CH=, —N($R^4$)—, —CH($R^4$)—, —N<, or —CH<;
wherein at least one of $X^1$, $X^2$, $X^3$, and $X^4$ contains a nitrogen atom;
wherein $R^1$, $R^2$, $R^3$, and $R^4$ are the same or different, and each represents a hydrogen atom, a C1-20 linear, branched, or cyclic alkyl group, a C6-20 aryl group, a C2-10 alkenyl group, a C2-10 alkynyl group, a carboxy group, or a cyano group, wherein each of the alkyl group and aryl group is optionally substituted with a C1-6 acyl group, a C1-6 alkoxy group, a C1-6 alkoxycarbonyl group, an amino group, a glycidyl group, or a hydroxy group, and is optionally interrupted by an oxygen atom or a sulfur atom;
$R^5$, $R^6$, $R^9$, and $R^{10}$ are the same or different, and each represents a hydrogen atom, a hydroxy group, a C1-6 acyl group, a C1-6 alkoxy group, a C1-6 alkoxycarbonyl group, a C1-10 linear, branched, or cyclic alkyl group, a C6-20 aryl group, a C2-20 alkenyl group, or a C2-10 alkynyl group, wherein each of the acyl group, alkoxy group, alkoxycarbonyl group, alkyl group, aryl group, alkenyl group, and alkynyl group optionally has one or two or more groups selected from the group consisting of an amino group, a nitro group, a cyano group, a hydroxy group, a glycidyl group, and a carboxy group;
$R^7$ and $R^8$ are the same or different, and each represents a benzene ring or a naphthalene ring;
n and o are 0 or 1; and
$B^1$ and $B^2$ are the same or different, and each represents a hydrogen atom, a C1-20 linear, branched, or cyclic alkyl group which is optionally interrupted by an oxygen atom or a sulfur atom, or an aromatic compound derived group selected from the group consisting of a C6-40 aryl group and a C6-40 heterocyclic group, wherein $B^1$ and $B^2$ and the carbon atom to which they are bonded optionally form a ring together, and wherein a hydrogen atom of the aromatic compound derived group is optionally replaced by a C1-20 alkyl group, a phenyl group, a fused ring group, a heterocyclic group, a hydroxy group, an amino group, an ether group, an alkoxy group, a cyano group, a nitro group, or a carboxy group.

4. A resist underlayer film forming composition, comprising a compound containing at least one unit of one or two or more repeating units j, k, l, m, r, s, t, u, v, and w represented by the following Formula (3):

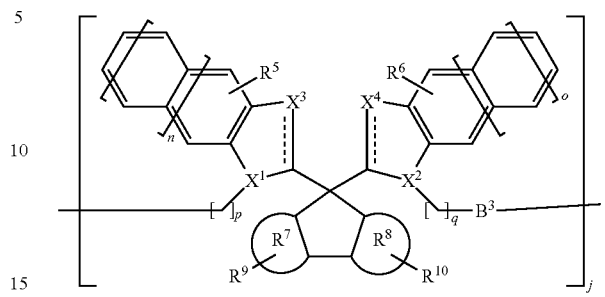

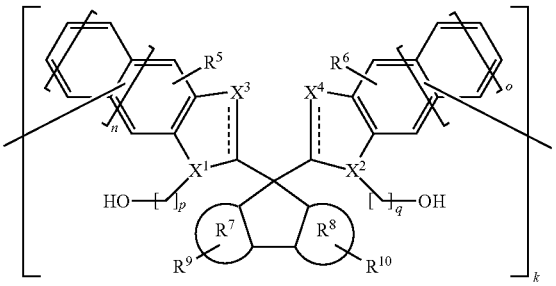

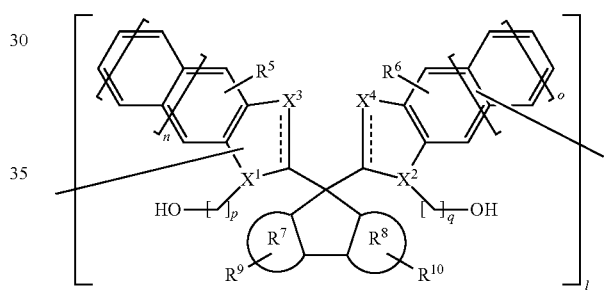

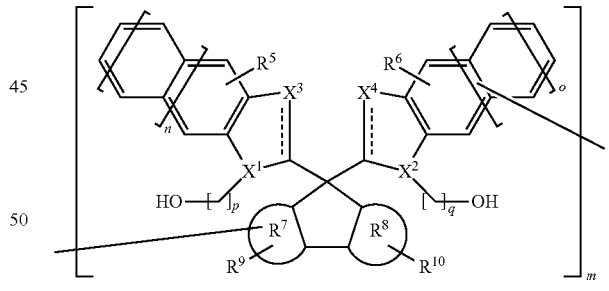

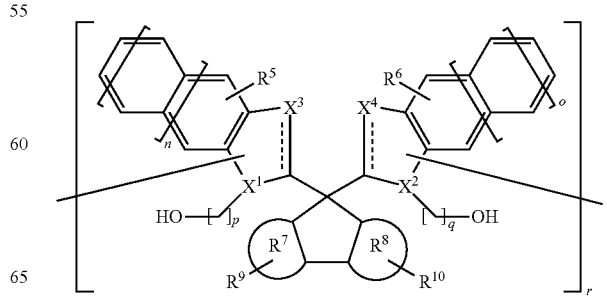

-continued

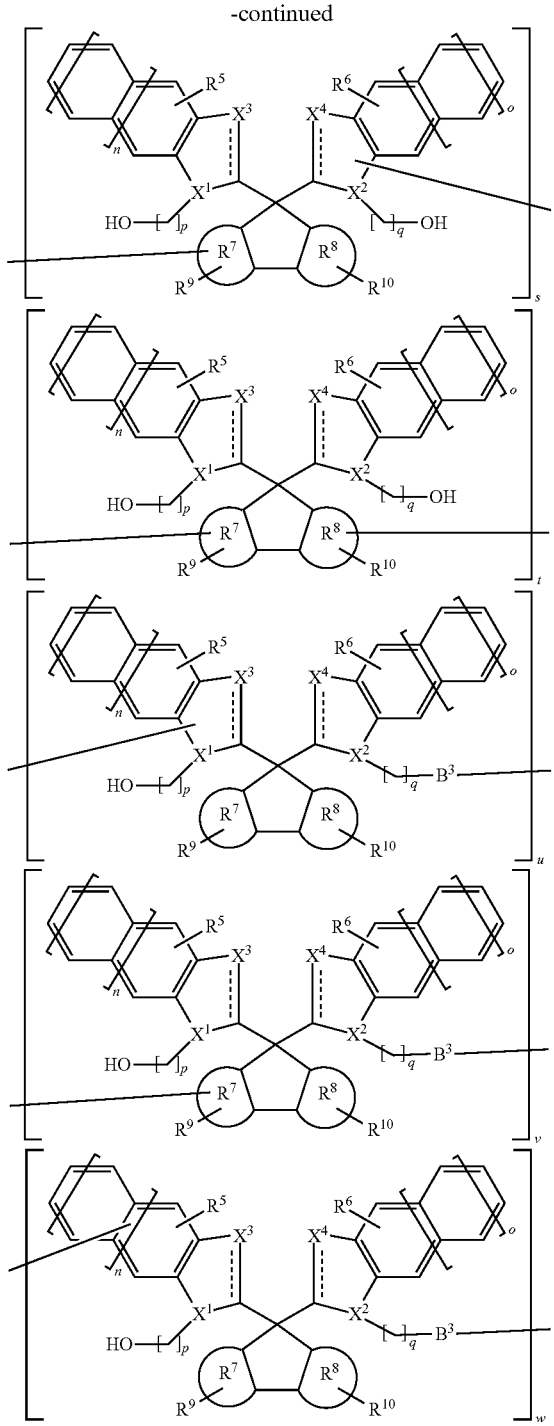

Formula (3)
wherein:
~~~ represents a single bond or a double bond;
$X^1$ represents —N< or —CH<;
$X^2$ represents —N< or —CH<;
$X^3$ represents —N=, —CH=, —N($R^3$)—, or —CH($R^3$)—;
$X^4$ represents —N=, —CH=, —N($R^4$)—, or —CH($R^4$)—;
wherein at least one of $X^1$, $X^2$, $X^3$, and $X^4$ contains a nitrogen atom;

wherein $R^3$ and $R^4$ are the same or different, and each represents a hydrogen atom, a C1-20 linear, branched, or cyclic alkyl group, a C6-20 aryl group, a C2-10 alkenyl group, a C2-10 alkynyl group, a carboxy group, or a cyano group, wherein each of the alkyl group and aryl group is optionally substituted with a C1-6 acyl group, a C1-6 alkoxy group, a C1-6 alkoxycarbonyl group, an amino group, a glycidyl group, or a hydroxy group, and is optionally interrupted by an oxygen atom or a sulfur atom;

$R^5$, $R^6$, $R^9$, and $R^{10}$ are the same or different, and each represents a hydrogen atom, a hydroxy group, a C1-6 acyl group, a C1-6 alkoxy group, a C1-6 alkoxycarbonyl group, a C1-10 linear, branched, or cyclic alkyl group, a C6-20 aryl group, a C2-20 alkenyl group, or a C2-10 alkynyl group, wherein each of the acyl group, alkoxy group, alkoxycarbonyl group, alkyl group, aryl group, alkenyl group, and alkynyl group optionally has one or two or more groups selected from the group consisting of an amino group, a nitro group, a cyano group, a hydroxy group, a glycidyl group, and a carboxy group;

$R^7$ and $R^8$ are the same or different, and each represents a benzene ring or a naphthalene ring;

n and o are 0 or 1;

p and q are an integer of 0 to 20, with the proviso that, when the p quantity of methylene group or the q quantity of methylene group are two or more, they are optionally interrupted by an oxygen atom or a sulfur atom; and $B^3$ represents a direct bond, or a C6-40 aromatic compound derived group which is optionally substituted with a C1-20 alkyl group, a phenyl group, a fused ring group, a heterocyclic group, a hydroxy group, an amino group, an ether group, an alkoxy group, a cyano group, a nitro group, or a carboxy group.

5. A resist underlayer film forming composition, comprising a resin which is a reaction product of a compound of Formula (1) below and at least one aldehyde compound; a reaction product of a compound of Formula (1) below and at least one aromatic compound; or a reaction product of a compound of Formula (1) below, at least one aromatic compound, and at least one aldehyde compound:

Formula (1)

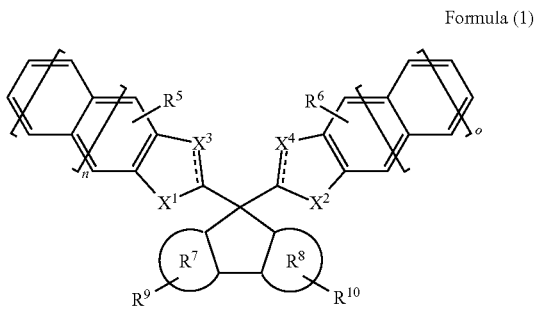

wherein:
~~~ represents a single bond or a double bond;
$X^1$ represents —N($R^1$)— or —CH($R^1$)—;
$X^2$ represents —N($R^2$)— or —CH($R^2$)—;
$X^3$ represents —N=, —CH=, —N($R^3$)—, or —CH($R^3$)—;
$X^4$ represents —N=, —CH=, —N($R^4$)—, or —CH($R^4$)—;

wherein at least one of $X^1$, $X^2$, $X^3$, and $X^4$ contains a nitrogen atom;

wherein $R^1$, $R^2$, $R^3$, and $R^4$ are the same or different, and each represents a hydrogen atom, a C1-20 linear, branched, or cyclic alkyl group, a C6-20 aryl group, a C2-10 alkenyl group, a C2-10 alkynyl group, a carboxy group, or a cyano group, wherein each of the alkyl group and aryl group is optionally substituted with a C1-6 acyl group, a C1-6 alkoxy group, a C1-6 alkoxycarbonyl group, an amino group, a glycidyl group, or a hydroxy group, and is optionally interrupted by an oxygen atom or a sulfur atom;

$R^5$, $R^6$, $R^9$, and $R^{10}$ are the same or different, and each represents a hydrogen atom, a hydroxy group, a C1-6 acyl group, a C1-6 alkoxy group, a C1-6 alkoxycarbonyl group, a C1-10 linear, branched, or cyclic alkyl group, a C6-20 aryl group, a C2-20 alkenyl group, or a C2-10 alkynyl group, wherein each of the acyl group, alkoxy group, alkoxycarbonyl group, alkyl group, aryl group, alkenyl group, and alkynyl group optionally has one or two or more groups selected from the group consisting of an amino group, a nitro group, a cyano group, a hydroxy group, a glycidyl group, and a carboxy group;

$R^7$ and $R^8$ are the same or different, and each represents a benzene ring or a naphthalene ring; and n and o are 0 or 1.

6. The resist underlayer film forming composition according to claim 5, wherein the $R^1$, $R^2$, $R^3$, or $R^4$ in Formula (1) is a hydroxy group or a C1-20 linear, branched, or cyclic alkyl group which is optionally substituted with a hydroxy group, and which is optionally interrupted by an oxygen atom or a sulfur atom.

7. The resist underlayer film forming composition according to claim 1, further comprising a crosslinking agent.

8. The resist underlayer film forming composition according to claim 1, further comprising an acid and/or an acid generator.

9. A method for producing a resist underlayer film, comprising the steps of applying the resist underlayer film forming composition according to claim 1 onto a semiconductor substrate, and baking the applied composition.

10. A method for producing a semiconductor device, comprising the steps of: forming on a semiconductor substrate a resist underlayer film from the resist underlayer film forming composition according to claim 1; forming a resist film on the resist underlayer film; subjecting the resist film to irradiation with a light or an electron beam and development to form a resist pattern; etching the resist underlayer film with the resist pattern; and processing the semiconductor substrate using the patterned resist underlayer film.

11. A method for producing a semiconductor device, comprising the steps of: forming on a semiconductor substrate a resist underlayer film from the resist underlayer film forming composition according to claim 1; forming a hard mask on the resist underlayer film; forming a resist film on the hard mask; subjecting the resist film to irradiation with a light or an electron beam and development to form a resist pattern; etching the hard mask with the resist pattern; etching the resist underlayer film with the patterned hard mask; and processing the semiconductor substrate using the patterned resist underlayer film.

12. A method for producing a resin for a resist underlayer film forming composition, comprising the step of: reacting a compound of Formula (1) below and at least one aldehyde compound; reacting a compound of Formula (1) below and at least one aromatic compound; or reacting a compound of Formula (1) below, at least one aromatic compound, and at least one aldehyde compound:

Formula (1)

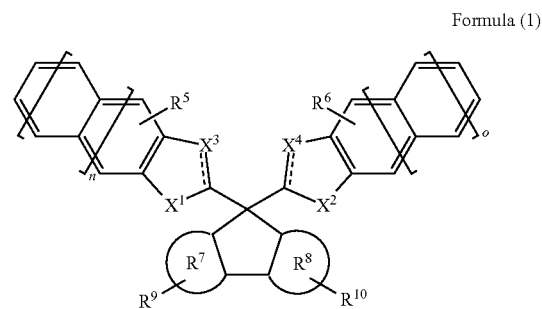

wherein:

~~~~~ represents a single bond or a double bond;

$X^1$ represents —N($R^1$)— or —CH($R^1$)—;

$X^2$ represents —N($R^2$)— or —CH($R^2$)—;

$X^3$ represents —N=, —CH=, —N($R^3$)—, or —CH($R^3$)—;

$X^4$ represents —N=, —CH=, —N($R^4$)—, or —CH($R^4$)—;

wherein at least one of $X^1$, $X^2$, $X^3$, and $X^4$ contains a nitrogen atom;

wherein $R^1$, $R^2$, $R^3$, and $R^4$ are the same or different, and each represents a hydrogen atom, a C1-20 linear, branched, or cyclic alkyl group, a C6-20 aryl group, a C2-10 alkenyl group, a C2-10 alkynyl group, a carboxy group, or a cyano group, wherein each of the alkyl group and aryl group is optionally substituted with a C1-6 acyl group, a C1-6 alkoxy group, a C1-6 alkoxycarbonyl group, an amino group, a glycidyl group, or a hydroxy group, and is optionally interrupted by an oxygen atom or a sulfur atom;

$R^5$, $R^6$, $R^9$, and $R^{10}$ are the same or different, and each represents a hydrogen atom, a hydroxy group, a C1-6 acyl group, a C1-6 alkoxy group, a C1-6 alkoxycarbonyl group, a C1-10 linear, branched, or cyclic alkyl group, a C6-20 aryl group, a C2-20 alkenyl group, or a C2-10 alkynyl group, wherein each of the acyl group, alkoxy group, alkoxycarbonyl group, alkyl group, aryl group, alkenyl group, and alkynyl group optionally has one or two or more groups selected from the group consisting of an amino group, a nitro group, a cyano group, a hydroxy group, a glycidyl group, and a carboxy group;

$R^7$ and $R^8$ are the same or different, and each represents a benzene ring or a naphthalene ring; and n and o are 0 or 1.

* * * * *